(12) United States Patent
Kim et al.

(10) Patent No.: US 11,730,023 B2
(45) Date of Patent: Aug. 15, 2023

(54) DISPLAY APPARATUS FOR MINIMIZING WIDTH OF BEZEL

(71) Applicant: LG Display Co., Ltd., Seoul (KR)

(72) Inventors: HongJae Kim, Paju-si (KR); Hoon Jeong, Paju-si (KR); Byoungwoo Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 421 days.

(21) Appl. No.: 16/945,215

(22) Filed: Jul. 31, 2020

(65) Prior Publication Data

US 2021/0066439 A1   Mar. 4, 2021

(30) Foreign Application Priority Data

Aug. 28, 2019   (KR) .................. 10-2019-0105579

(51) Int. Cl.
*H10K 59/131*   (2023.01)
*H10K 50/84*   (2023.01)
*H10K 59/38*   (2023.01)

(52) U.S. Cl.
CPC .......... *H10K 59/131* (2023.02); *H10K 50/84* (2023.02); *H10K 59/38* (2023.02)

(58) Field of Classification Search
CPC ............... H01L 27/3276; H01L 27/322; H01L 51/5237
USPC ........................................... 257/40
See application file for complete search history.

(56) References Cited

U.S. PATENT DOCUMENTS

| | | |
|---|---|---|
| 2012/0044225 A1* | 2/2012 | Kim ............... G09G 3/3614 345/96 |
| 2012/0194773 A1 | 8/2012 | Kim |
| 2014/0043306 A1 | 2/2014 | Min et al. |
| 2016/0225304 A1 | 8/2016 | Kim |
| 2017/0046999 A1 | 2/2017 | Kim et al. |
| 2017/0194409 A1 | 7/2017 | Jeong |
| 2019/0114981 A1* | 4/2019 | Yoshida ........... G09G 3/3648 |
| 2019/0131377 A1* | 5/2019 | Kwon ............. H01L 27/3272 |

FOREIGN PATENT DOCUMENTS

| | | |
|---|---|---|
| CN | 107025014 A | 8/2017 |
| EP | 3 675 112 A1 | 7/2020 |
| JP | 2006-189767 A | 7/2006 |
| JP | 2019-74583 A | 5/2019 |

* cited by examiner

*Primary Examiner* — Xia L Cross
(74) *Attorney, Agent, or Firm* — Birch, Stewart, Kolasch & Birch, LLP

(57) ABSTRACT

Disclosed is a display apparatus in which a gate driving circuit is disposed in each of non-display areas other than a non-display area including a pad part among a plurality of non-display areas, and a plurality of connection lines provided on a layer differing from a plurality of gate lines and connected to the gate lines are provided.

14 Claims, 21 Drawing Sheets

Double feeding (a)

(b)

(c)

(a)

(b)

(c)

DISPLAY APPARATUS FOR MINIMIZING WIDTH OF BEZEL

CROSS-REFERENCE TO RELATED APPLICATIONS

This application claims the priority benefit of the Korean Patent Application No. 10-2019-0105579 filed on Aug. 28, 2019, which is hereby incorporated by reference as if fully set forth herein into the present application.

BACKGROUND

Field of the Invention

The present disclosure relates to a display apparatus.

Discussion of the Related Art

Display apparatuses are being widely used as display screens of notebook computers, tablet computers, smartphones, portable display apparatuses, and portable information devices in addition to display apparatuses of televisions (TVs) and monitors. Examples of the display apparatuses include liquid crystal display (LCD) apparatuses and light emitting display apparatuses. Since the light emitting display apparatuses display an image by using a self-emitting device, the light emitting display apparatuses have a fast response time, low power consumption, and a good viewing angle, and thus, are attracting much attention as next-generation display apparatuses.

The display apparatuses can each include a gate driver which supplies a gate pulse to a plurality of gate lines, and by using a shift register, the gate driver can sequentially shift the gate pulse applied to the plurality of gate lines. Also, since the shift register and a pixel array are provided on a substrate of a display panel, the display apparatuses can each have a gate-in panel (GIP) structure.

In a related art display apparatus, since the shift register is disposed in each of a left non-display area and a right non-display area of the substrate, the gate pulse can be supplied through a double feeding method or an interlacing method. In this case, the double feeding method has a problem where a design area of the shift register increases to increase the left bezel area and the right bezel area, and when the interlacing method is applied to a large display panel, the interlacing method has a problem where the delay of the gate pulse increases in a direction distancing from an input terminal to which the gate pulse is input.

Moreover, the related art display apparatus does not include a structure for reducing a parasitic capacitance between metal lines included in a display panel.

Moreover, the related art display apparatus should include a structure for covering a pad part exposed at a front surface of the display panel. Therefore, in the related art display apparatus, at least one of four side surfaces of a front cover supporting the display panel should surround the display panel at a front portion of the display panel. Therefore, it is difficult to decrease a size of a front bezel of a front cover of a display apparatus.

SUMMARY

Accordingly, the present disclosure is directed to providing a display apparatus that substantially obviates one or more problems due to limitations and disadvantages of the related art.

An aspect of the present disclosure is directed to providing a display apparatus in which a gate driving circuit is disposed in each of non-display areas other than a non-display area including a pad part among a plurality of non-display areas, and a plurality of connection lines provided on a layer differing from a plurality of gate lines and connected to the gate lines are provided.

Additional advantages and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these and other advantages and in accordance with the purpose of the disclosure, as embodied and broadly described herein, there is provided a display apparatus including a display panel including a display area including a plurality of pixels connected to a plurality of gate lines, and first to fourth non-display areas surrounding the display area, a pad part disposed in the first non-display area, a first gate driving circuit disposed in the second non-display area to drive a first gate line group among the plurality of gate lines, a second gate driving circuit disposed in the third non-display area to drive a second gate line group among the plurality of gate lines, and a third gate driving circuit disposed in the fourth non-display area to drive the first and second gate line groups. The display panel includes a plurality of connection lines connecting gate lines of the first and second gate line groups to the third gate driving circuit.

Details of other embodiments are included in the detailed description and the drawings.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
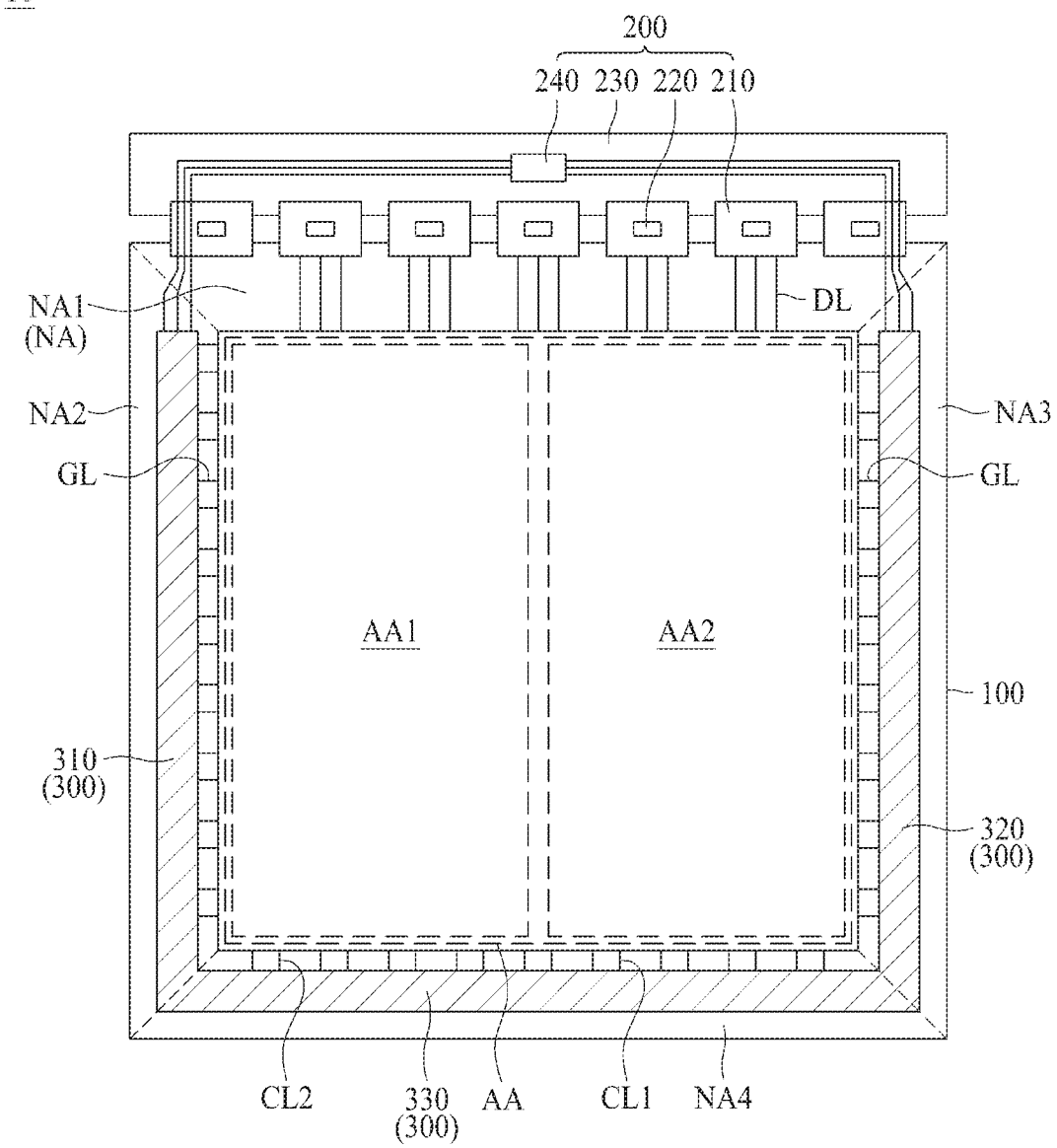
FIG. 1 is a plan view illustrating a display apparatus according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part can be added unless 'only-' is used. The terms of a singular form can include plural forms unless referred to the contrary.

In construing an element, the element is construed as including an error range although there is no explicit description.

In describing a position relationship, for example, when a position relation between two parts is described as 'on-', 'over-', 'under-', and 'next-', one or more other parts can be disposed between the two parts unless 'just' or 'direct' is used.

In describing a time relationship, for example, when the temporal order is described as 'after-', 'subsequent-', 'next-', and 'before-', a case which is not continuous can be included unless 'just' or 'direct' is used.

It will be understood that, although the terms "first", "second", etc. can be used herein to describe various elements, these elements should not be limited by these terms. These terms are only used to distinguish one element from another and does not necessarily define any order. For example, a first element could be termed a second element, and, similarly, a second element could be termed a first element, without departing from the scope of the present disclosure.

In describing elements of the present disclosure, the terms "first", "second", etc. can be used. The terms are merely for differentiating one element from another element, and the essence, sequence, order, or number of a corresponding element should not be limited by the terms. It will be understood that when an element or layer is described as being "connected", "coupled", or "adhered" to another element or layer, the element or layer can be directly connected or adhered to the other element or layer, but the other element or layer can be "disposed" between elements or layers, or elements or layers can be "connected", "coupled", or "adhered" to each other through the other element or layer.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, embodiments of a light emitting display apparatus according to the present disclosure will be described in detail with reference to the accompanying drawings. In adding reference numerals to elements of each of the drawings, although the same elements are illustrated in other drawings, like reference numerals can refer to like elements.

Figure 2:
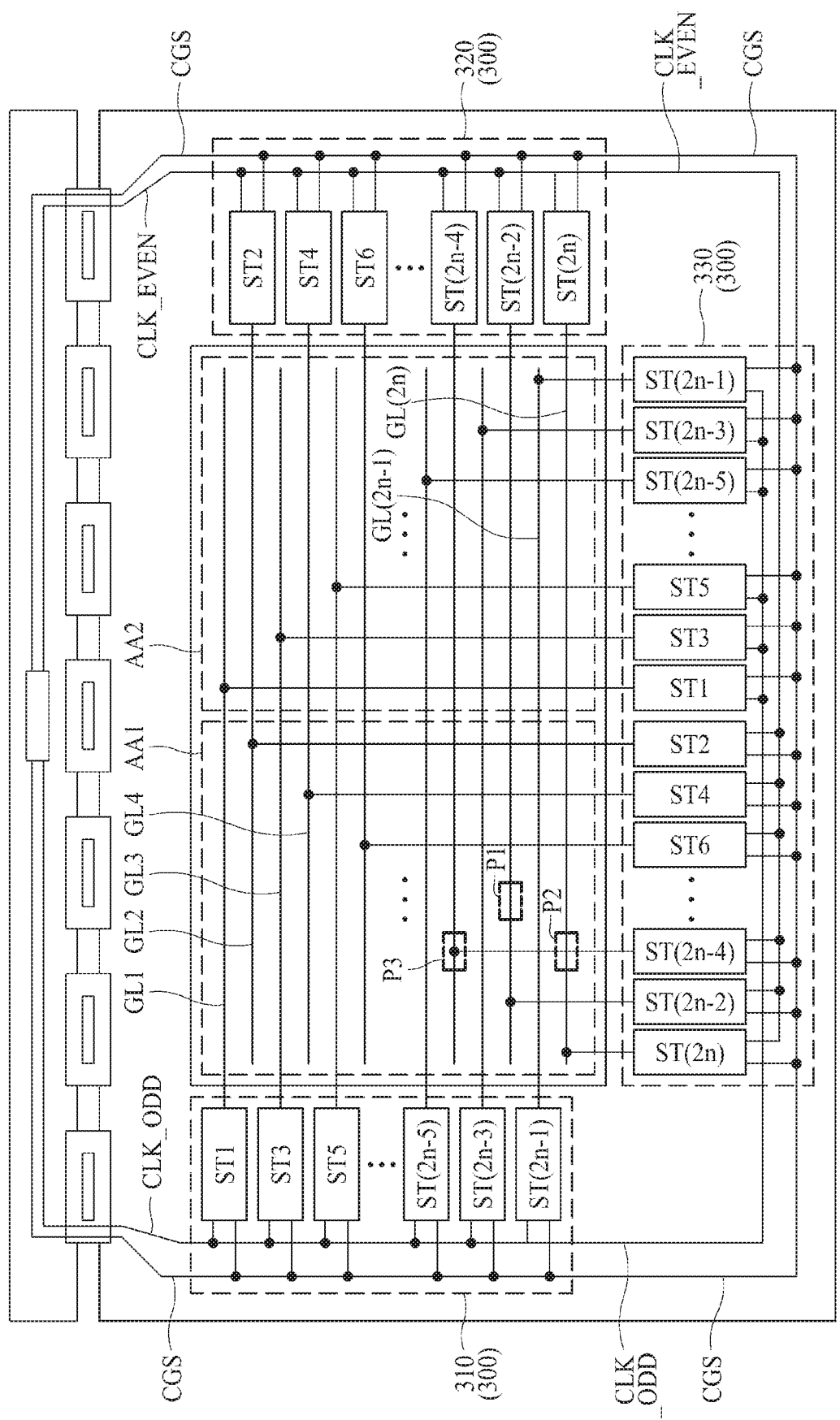
FIG. 2 is a diagram illustrating a connection relationship between a plurality of stages and a plurality of gate lines in a display apparatus according to a first embodiment of the present disclosure.

FIG. 1 is a plan view illustrating a display apparatus 10 according to an embodiment of the present disclosure, and FIG. 2 is a diagram illustrating a connection relationship between a plurality of stages and a plurality of gate lines in a display apparatus according to a first embodiment of the present disclosure. All the components of the display apparatus according to all embodiments of the present disclosure are operatively coupled and configured.

Referring to FIGS. 1 and 2, the display apparatus 10 can include a display panel 100, a display driver 200, and a gate driver 300.

The display panel 100 can include a display area AA and a non-display area NA. The display panel 100 can be a liquid crystal display panel or an organic light emitting display panel, but is not limited thereto and can be various kinds of panels.

When the display panel 100 is a liquid crystal display panel, a color filter for realizing a color can be provided in an upper substrate which is disposed with a liquid crystal between the upper substrate and a thin film transistor (TFT) substrate (a lower substrate) including a transistor.

However, the color filter can be provided in a planarization layer which covers the transistor. For example, the transistor can be provided in the transistor substrate, the planarization layer can be provided on the transistor so as to remove a step height of the transistor, a pixel electrode can be provided on the planarization layer, and a liquid crystal layer can be provided on the planarization layer and the pixel electrode. In this case, the planarization layer can be configured with at least two layers, and moreover, the color filter can perform a function of a planarization layer. In this case, since a color filter is not provided in the upper substrate, a process of manufacturing the upper substrate and a structure of the upper substrate can be simplified. Hereinafter, this will be described in detail with reference to FIGS. 17 to 19.

The display area AA can be an area which displays an image and can be defined in a center portion of each substrate. Here, the display area AA can correspond to an active area of a pixel array layer. For example, the display area AA can include a plurality of pixels which are respectively provided in a plurality of pixel areas defined by intersections of a plurality of data lines DL and a plurality of gate lines GL. Here, each of the plurality of pixels can be defined as a minimum-unit area which emits light.

The display area AA can include a first display area AA1 and a second display area AA2.

The first display area AA1 can correspond to a left area of the display area AA and can be adjacent to a first gate driving circuit 310. For example, one end (for example, a left end) of the first display area AA1 can face the first gate driving circuit 310, and the other end (for example, a lower end) vertical to the one end of the first display area AA1 can face even stages ST2 to ST(2n) (where n is a natural number equal to or more than four) of a third gate driving circuit 330. Therefore, one end of each of odd gate lines GL1 to GL(2n-1) (where n is a natural number equal to or more than four) disposed in the first display area AA1 can be connected to the first gate driving circuit 310 and can receive a gate pulse, and even gate lines GL2 to GL(2n) (where n is a natural number equal to or more than four) disposed in the first display area AA1 can be connected to even stages ST2 to ST(2n) of the third gate driving circuit 330 through the second connection line CL2 and can receive the gate pulse.

The first and second connection lines CL1 and CL2 and the gate lines can be provided on different layers with an insulation layer therebetween. In this case, each of the connection lines and one gate line corresponding thereto can be electrically connected to each other through a contact hole.

When the display panel 100 is a liquid crystal display panel, the first and second connection lines can be provided in the TFT substrate through the same process as one of transistors included in each pixel and metals included in the pixel electrode.

For example, when the display panel 100 is a liquid crystal display panel, the first and second connection lines can be provided in the TFT substrate and can be covered by the insulation layer, and the transistors can be provided on the insulation layer. That is, the first and second connection lines can be provided under the transistors so as to be insulated from the transistors. In this case, since a parasitic capacitance does not occur between metal lines configuring the transistors and the first and second connection lines, the driving efficiency of the transistors can be enhanced, and a load of each of the first and second connection lines can decrease. Hereinafter, this will be described in detail with reference to FIGS. 15 and 16.

The second display area AA2 can correspond to a right area of the display area AA and can be adjacent to a second gate driving circuit 320. For example, one end (for example, a right end) of the second display area AA2 can face the second gate driving circuit 320, and the other end (for example, a lower end) vertical to the one end of the second display area AA2 can face odd stages ST1 to ST(2n-1) (where n is a natural number equal to or more than four) of the third gate driving circuit 330. Therefore, one end of each of even gate lines GL2 to GL(2n) disposed in the second display area AA2 can be connected to the second gate driving circuit 320 and can receive the gate pulse, and odd gate lines GL1 to GL(2n-1) disposed in the second display area AA2 can be connected to odd stages ST1 to ST(2n-1) of the third gate driving circuit 330 through the first connection line CL1 and can receive the gate pulse.

The non-display area NA can be an area which does not display an image and can be defined in an edge portion of each substrate surrounding the display area AA. Also, the non-display area NA can include first to fourth non-display areas NA1 to NA4 facing an upper end, a left end, a right end, and a lower end of the display area AA.

The first non-display area NA1 can be disposed on the display area AA and can be connected to the display driver 200, and moreover, can include a pad part electrically connected to the display driver 200. For example, the pad part of the first non-display area NA1 can be connected to a plurality of circuit films 210 of the display driver 200.

The second non-display area NA2 can be disposed in the left end of the display area AA and can accommodate the first gate driving circuit 310. In detail, the second non-display area NA2 can accommodate the odd stages ST1 to ST(2n-1) of the first gate driving circuit 310. Here, the odd stages ST1 to ST(2n-1) can correspond to odd-numbered stages ST1 to ST(2n-1) of a plurality of stages. Also, the second non-display area NA2 can accommodate one end of each of the odd gate lines GL1 to GL(2n-1) or a first gate line group connected to the odd stages ST1 to ST(2n-1) of the first gate driving circuit 310. Also, the second non-display area NA2 can extend from the display driver 200 and can accommodate a common signal line CGS and an odd clock line CLK_ODD each connected to the first gate driving circuit 310.

The third non-display area NA3 can be disposed in the right end of the display area AA and can accommodate the second gate driving circuit 320. In detail, the third non-display area NA3 can accommodate the even stages ST2 to ST(2n) of the second gate driving circuit 320. Here, the even stages ST2 to ST(2n) can correspond to even-numbered stages ST2 to ST(2n) of the plurality of stages. Also, the third non-display area NA3 can accommodate one end of each of the even gate lines GL2 to GL(2n) or a second gate line group connected to the even stages ST2 to ST(2n) of the second gate driving circuit 320. Also, the third non-display area NA3 can extend from the display driver 200 and can accommodate the common signal line CGS and an even clock line CLK_EVEN each connected to the second gate driving circuit 320.

The fourth non-display area NA4 can be disposed in the lower end of the display area AA and can accommodate the third gate driving circuit 330. In detail, the fourth non-display area NA4 can accommodate the odd stages ST1 to ST($2n$-1) and the even stages ST2 to ST($2n$) of the third gate driving circuit 330. Also, the fourth non-display area NA4 can accommodate one end of the first connection line CL1 connected to the odd gate lines GL1 to GL($2n$-1) and one end of the second connection line CL2 connected to the even gate lines GL2 to GL($2n$). Also, the fourth non-display area NA4 can extend from the second or third non-display area NA2 or NA3 and can accommodate the common signal line CGS, the odd clock line CLK_ODD, and the even clock line CLK_EVEN each connected to the third gate driving circuit 320.

The display panel 100 can further include the plurality of gate lines, the plurality of data lines DL, and the first and second connection lines CL1 and CL2.

The plurality of gate lines GL can long extend in a first direction and can be apart from one another in a second direction intersecting the first direction. In detail, the plurality of gate lines GL can include a first gate line group GL1 to GL($2n$-1) and a second gate line group GL2 to GL($2n$). Here, the first gate line group can include the odd gate lines GL1 to GL($2n$-1), which are odd-numbered gate lines, of the plurality of gate lines GL, and the second gate line group can include the even gate lines GL2 to GL($2n$), which are even-numbered gate lines, of the plurality of gate lines GL. The plurality of gate lines GL can receive the gate pulse from the gate driver 300 and can sequentially drive the plurality of pixels.

According to an embodiment, one end of each of the odd gate lines GL1 to GL($2n$-1) can be directly connected to the first gate driving circuit 310 and can receive the gate pulse, and the odd gate lines GL1 to GL($2n$-1) can be connected to the first connection line CL1 in the second display area AA2 and can receive the gate pulse from the odd stages ST1 to ST($2n$-1) of the third gate driving circuit 330.

According to an embodiment, one end of each of the even gate lines GL2 to GL($2n$) can be directly connected to the second gate driving circuit 320 and can receive the gate pulse, and the even gate lines GL2 to GL($2n$) can be connected to the second connection line CL2 in the first display area AA1 and can receive the gate pulse from the even stages ST2 to ST($2n$) of the third gate driving circuit 330.

The plurality of data lines DL can long extend in the second direction and can be apart from one another in the first direction. Each of the plurality of data lines DL can receive a data voltage from the display driver 200 to control luminance of a light emitting device included in a corresponding pixel of the plurality of pixels.

The first connection line CL1 can be provided in plurality, and the plurality of first connection lines CL1 can long extend in the second direction and can be apart from one another in the first direction. The plurality of first connection lines CL1 can be directly connected to the odd stages ST1 to ST($2n$-1) of the third gate driving circuit 330 and can extend to the second display area AA2. Therefore, the first connection line CL1 can connect points of the odd gate lines GL1 to GL($2n$-1) of the second display area AA2 to the odd stages ST1 to ST($2n$-1) of the third gate driving circuit 330.

The second connection line CL2 can be provided in plurality, and the plurality of second connection lines CL2 can long extend in the second direction and can be apart from one another in the first direction. The plurality of second connection lines CL2 can be directly connected to the even stages ST2 to ST($2n$) of the third gate driving circuit 330 and can extend to the first display area AA1. Therefore, the second connection line CL2 can connect points of the even gate lines GL2 to GL($2n$) of the first display area AA1 to the even stages ST2 to ST($2n$) of the third gate driving circuit 330.

Each of the plurality of pixels can be provided in a corresponding pixel area defined by a corresponding gate line GL and a corresponding data line DL each disposed in the display area AA. According to an embodiment, each of the plurality of pixels can include a pixel circuit including a driving transistor and a light emitting device connected to the pixel circuit.

The display driver 200 can be connected to the pad part provided in the non-display area NA of the display panel 100 and can display an image, corresponding to video data supplied from a display driving system, on each pixel. According to an embodiment, the display driver 200 can include a plurality of circuit films 210, a plurality of data driving integrated circuits (ICs) 220, a printed circuit board (PCB) 230, and a timing controller 240.

Input terminals provided in one side of each of the plurality of circuit films 210 can be attached on the PCB 230 through a film attachment process, and output terminals provided in the other side of each of the plurality of circuit films 210 can be attached on the pad part through a film attachment process. According to an embodiment, each of the plurality of circuit films 210 can be implemented as a flexible circuit film and can be bent so as to decrease a bezel area of the display apparatus 10. For example, the plurality of circuit films 210 can each be configured as a tape carrier package (TCP) or a chip-on film (or a chip-on film board) (COF).

Each of the plurality of data driving ICs 220 can be individually mounted on a corresponding circuit film of the plurality of circuit films 210. Each of the plurality of data driving ICs 220 can receive a data control signal and pixel data each provided from the timing controller 240, convert the pixel data into a pixel-based analog data signal according to the data control signal, and supply the analog data signal to a corresponding data line.

The PCB 230 can support the timing controller 240 and can transfer signals and power between the elements of the display driver 200. The PCB 230 can provide a signal and a driving power, each supplied from the timing controller 240, to the data driving ICs 220 and a plurality of scan driving circuit units so as to display image on each pixel. To this end, a signal transfer line and various power lines can be provided on the PCB 230. For example, the PCB 230 can be provided as one or more, based on the number of circuit films 210.

The timing controller 240 can be mounted on the PCB 230 and can receive, through a user connector provided on the PCB 230, the video data and a timing synchronization signal each supplied from the display driving system. The timing controller 240 can align the video data to generate pixel data matching a pixel arrangement structure, based on the timing synchronization signal and can supply the generated pixel data to a corresponding data driving IC 220. Also, the timing controller 240 can generate the data control signal and a gate control signal on the basis of the timing synchronization signal, control a driving timing of each of the plurality of data driving ICs 220 by using the data control signal, and control a driving timing of the gate driver 300 by using the gate control signal. Here, the gate control signal can be supplied to the gate diver 300 through the first non-display area NA1 and first and/or last flexible circuit film of the plurality of circuit films 210.

The gate driver 300 can be connected to the plurality of gate lines GL provided in the display panel 100. In detail, the gate driver 300 can generate the gate pulse in a predetermined order, based on the gate control signal supplied from the timing controller 240 and can supply the gate pulse to a corresponding gate line GL. According to an embodiment, the gate driver 300 can include the first to third gate driving circuits 310 to 330.

The first gate driving circuit 310 can include the odd stages ST1 to ST(2n-1) respectively corresponding to the odd gate lines GL1 to GL(2n-1). In detail, the first gate driving circuit 310 can be integrated into a left edge (or the second non-display area NA2) of the display panel 100 through a process of manufacturing a TFT and can be connected to the odd gate lines GL1 to GL(2n-1). According to an embodiment, the first gate driving circuit 310 can include the odd stages ST1 to ST(2n-1) which are disposed in the second non-display area NA2 and respectively provide the gate pulse to the odd gate lines GL1 to GL(2n-1).

The second gate driving circuit 320 can include the even stages ST2 to ST(2n) respectively corresponding to the even gate lines GL2 to GL(2n). In detail, the second gate driving circuit 320 can be integrated into a right edge (or the third non-display area NA3) of the display panel 100 through a process of manufacturing a TFT and can be connected to the even gate lines GL2 to GL(2n). According to an embodiment, the second gate driving circuit 320 can include the even stages ST2 to ST(2n) which are disposed in the third non-display area NA3 and respectively provide the gate pulse to the even gate lines GL2 to GL(2n).

The third gate driving circuit 330 can include the odd stages ST1 to ST(2n-1) respectively corresponding to the odd gate lines GL1 to GL(2n-1) and the even stages ST2 to ST(2n) respectively corresponding to the even gate lines GL2 to GL(2n). In detail, the third gate driving circuit 330 can be integrated into a lower edge (or the fourth non-display area NA4) of the display panel 100 through a process of manufacturing the TFT and can be connected to the plurality of first connection lines CL1 and the plurality of second connection lines CL2. For example, the odd stages ST1 to ST(2n-1) of the third gate driving circuit 330 can be respectively connected to the odd gate lines GL1 to GL(2n-1) through the first connection line CL1, and the even stages ST2 to ST(2n) of the third gate driving circuit 330 can be respectively connected to the even gate lines GL2 to GL(2n) through the second connection line CL2.

Figure 3:
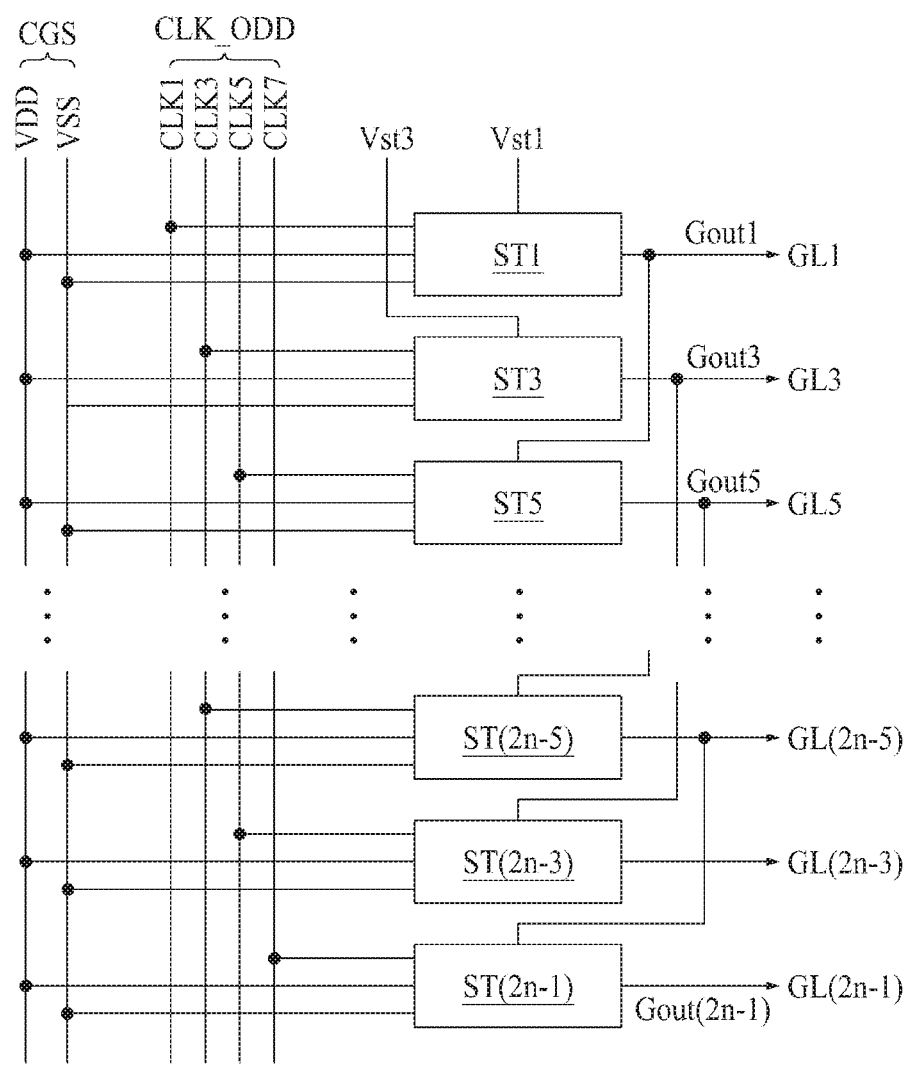
FIG. 3 is a diagram illustrating a first gate driving circuit in the display apparatus illustrated in FIG. 2.

FIG. 3 is a diagram illustrating a first gate driving circuit in the display apparatus illustrated in FIG. 2.

Referring to FIG. 3, the first gate driving circuit 310 can include odd stages ST1 to ST(2n-1) which supply a gate pulse to odd gate lines GL1 to GL(2n-1). That is, the first gate driving circuit 310 can include the odd stages ST1 to ST(2n-1) corresponding to the total number of odd gate lines GL1 to GL(2n-1). In detail, the first gate driving circuit 310 can be supplied with first and second driving voltages VDD and VSS through a common signal line CGS passing through a second non-display area NA2 and can receive an odd clock signal through an odd clock line CLK_ODD. Here, the odd clock signal can correspond to first, third, fifth, and seventh gate clocks CLK1, CLK3, CLK5, and CLK7. Also, each of the first, third, fifth, and seventh gate clocks CLK1, CLK3, CLK5, and CLK7 can have a phase which is sequentially shifted. In this case, the odd clock line CLK_ODD can transfer the first gate clock CLK1 to a 2k-7$^{th}$ stage ST(2k-7) (where k is a multiple of 4 equal to or less than n), transfer the third gate clock CLK3 to a 2k-5$^{th}$ stage ST(2k-5), transfer the fifth gate clock CLK5 to a 2k-3$^{th}$ stage ST(2k-3), and transfer the seventh gate clock CLK7 to a 2k-1$^{th}$ stage ST(2k-1).

The first and third stages ST1 and ST3 can be respectively enabled by first and third gate start signals Vst1 and Vst3 and can respectively receive the first and third gate clocks CLK1 and CLK3 to respectively supply gate pulses Gout1 and Gout3 to the first and third gate lines GL1 and GL3. Also, the first and third stages ST1 and ST3 can be respectively reset by output signals (or gate pulses) Gout5 and Gout7 of the fifth and seventh stages ST5 and ST7.

In this manner, the fifth to 2n-5$^{th}$ stages ST5 to ST(2n-5) of the odd stages ST1 to ST(2n-1) can be enabled by an output signal of a previous fourth stage and can respectively receive the gate clocks CLK1, CLK3, CLK5, and CLK7 corresponding thereto to supply gate pulses Gout5 to Gout(2n-5) to the odd gate lines GL5 to GL(2n-5). Also, the fifth to 2n-5$^{th}$ stages ST5 to ST(2n-5) can be reset by an output signal of a next fourth stage.

Moreover, the 2n-3$^{th}$ and 2n-1$^{th}$ stages ST(2n-3) and ST(2n-1) can be enabled by an output signal of a previous fourth stage and can respectively receive the gate clocks CLK5 and CLK7 corresponding thereto to respectively supply gate pulses Gout(2n-3) and Gout(2n-1) to the 2n-3$^{th}$ and 2n-1$^{th}$ gate lines GL(2n-3) and GL(2n-1). Also, the 2n-3$^{th}$ and 2n-1$^{th}$ stages ST(2n-3) and ST(2n-1) can be reset by first and third reset clocks.

In this manner, each of output signals Gout1 to Gout(2n-5) of the first to 2n-5$^{th}$ stages ST1 to ST(2n-5) can be supplied as a gate start signal of a next fourth stage, and each of output signals Gout5 to Gout(2n-1) of the fifth to 2n-1$^{th}$ stages ST5 to ST(2n-1) can be supplied as a reset clock of a previous fourth stage.

Figure 4:
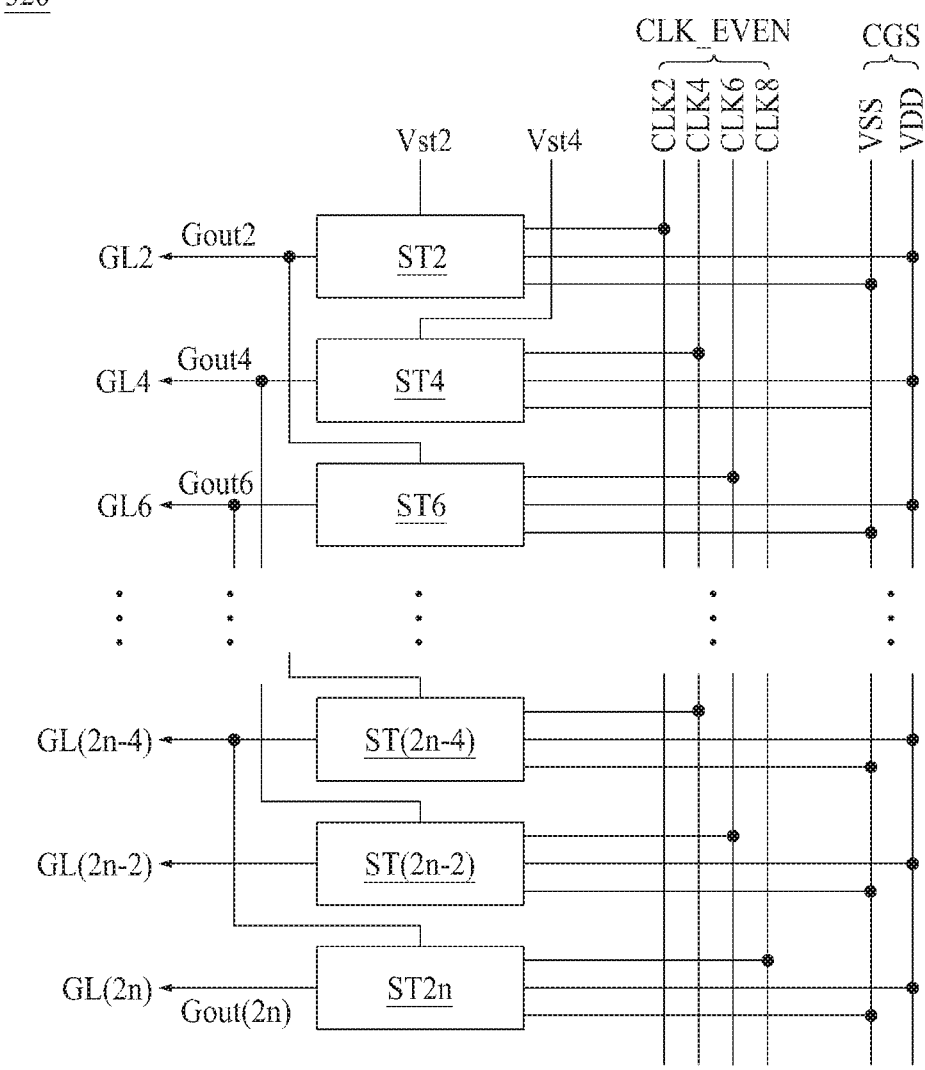
FIG. 4 is a diagram illustrating a second gate driving circuit in the display apparatus illustrated in FIG. 2.

FIG. 4 is a diagram illustrating a second gate driving circuit in the display apparatus illustrated in FIG. 2.

Referring to FIG. 4, the second gate driving circuit 320 can include even stages ST2 to ST(2n) which supply a gate pulse to even gate lines GL2 to GL(2n). That is, the second gate driving circuit 320 can include the even stages ST2 to ST(2n) corresponding to the total number of even gate lines GL2 to GL(2n). In detail, the second gate driving circuit 320 can be supplied with first and second driving voltages VDD and VSS through a common signal line CGS passing through a third non-display area NA3 and can receive an even clock signal through an even clock line CLK_EVEN. Here, the even clock signal can correspond to second, fourth, sixth, and eighth gate clocks CLK2, CLK4, CLK6, and CLK8. Also, each of the second, fourth, sixth, and eighth gate clocks CLK2, CLK4, CLK6, and CLK8 can have a phase which is sequentially shifted. In this case, the even clock line CLK_EVEN can transfer the second gate clock CLK2 to a 2k-6$^{th}$ stage ST(2k-6) (where k is a multiple of 4 equal to or less than n), transfer the fourth gate clock CLK4 to a 2k-4$^{th}$ stage ST(2k-4), transfer the sixth gate clock CLK6 to a 2k-2$^{th}$ stage ST(2k-2), and transfer the eighth gate clock CLK8 to a 2k$^{th}$ stage ST(2k).

The second and fourth stages ST2 and ST4 can be respectively enabled by second and fourth gate start signals Vst2 and Vst4 and can respectively receive the second and fourth gate clocks CLK2 and CLK4 to respectively supply gate pulses Gout2 and Gout4 to the second and fourth gate lines GL2 and GL4. Also, the second and fourth stages ST2 and ST4 can be respectively reset by output signals (or gate pulses) Gout6 and Gout8 of the sixth and eighth stages ST6 and ST8.

In this manner, the sixth to 2n-4$^{th}$ stages ST6 to ST(2n-4) of the even stages ST2 to ST(2n) can be enabled by an output signal of a previous fourth stage and can respectively receive the gate clocks CLK2, CLK4, CLK6, and CLK8 corresponding thereto to supply gate pulses Gout6 to Gout(2n-4) to the even gate lines GL6 to GL(2n-4). Also, the sixth to 2n-4$^{th}$ stages ST6 to ST(2n-4) can be reset by an output signal of a next fourth stage.

Moreover, the 2n-2$^{th}$ and 2n$^{th}$ stages ST(2n-2) and ST(2n) can be enabled by an output signal of a previous fourth stage and can respectively receive the gate clocks CLK6 and CLK8 corresponding thereto to respectively supply gate pulses Gout(2n-2) and Gout(2n) to the 2n-2$^{th}$ and 2n$^{th}$ gate lines GL(2n-2) and GL(2n). Also, the 2n-2$^{th}$ and 2n$^{th}$ stages ST(2n-2) and ST(2n) can be reset by second and fourth reset clocks.

In this manner, each of output signals Gout2 to Gout(2n-4) of the second to 2n-4$^{th}$ stages ST2 to ST(2n-4) can be supplied as a gate start signal of a next fourth stage, and each of output signals Gout6 to Gout(2n) of the sixth to 2n$^{th}$ stages ST6 to ST(2n) can be supplied as a reset clock of a previous fourth stage.

Figure 5:
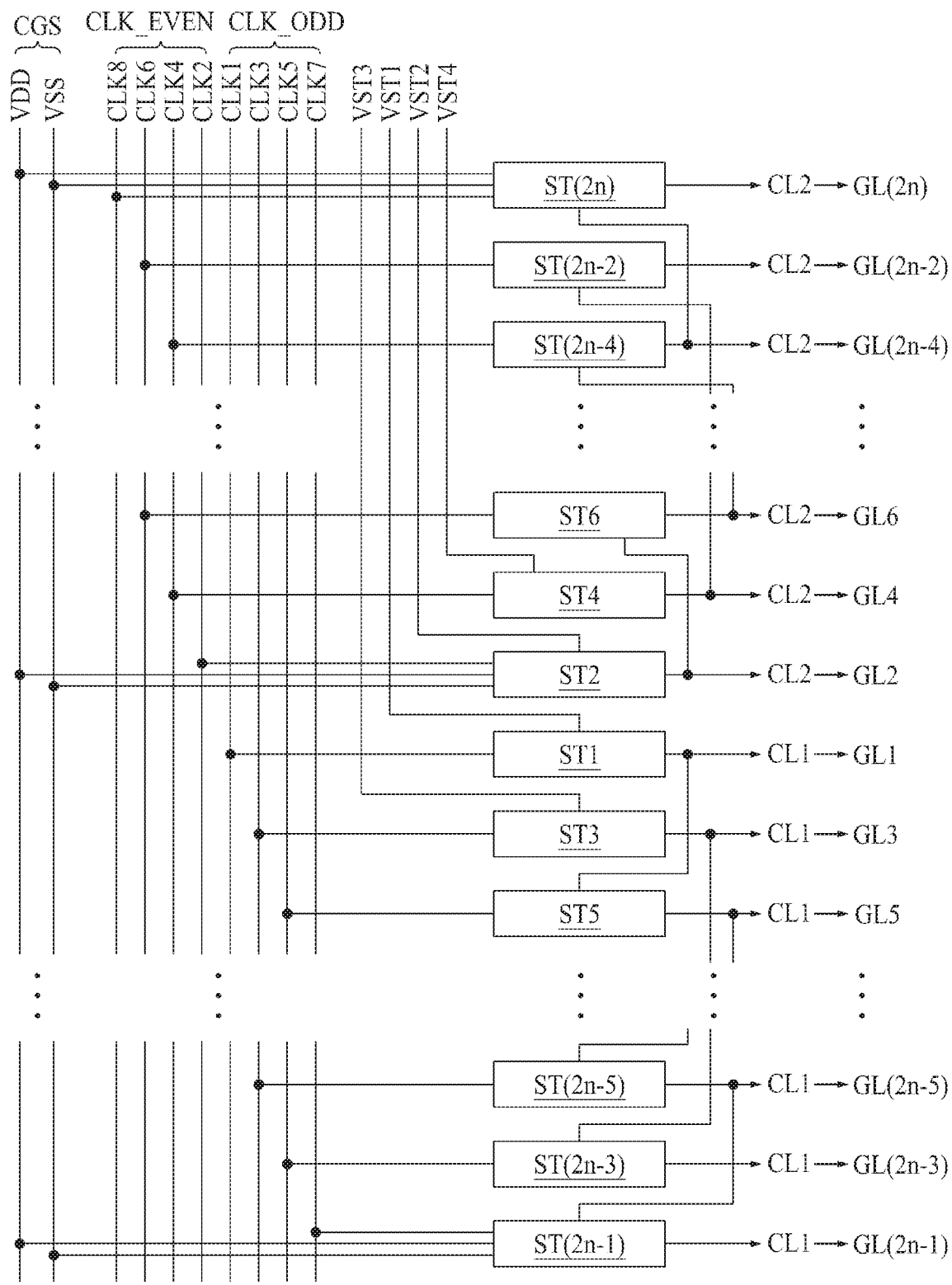
FIG. 5 is a diagram illustrating a third gate driving circuit in the display apparatus illustrated in FIG. 2.

FIG. 5 is a diagram illustrating a third gate driving circuit in the display apparatus illustrated in FIG. 2.

Referring to FIG. 5, the third gate driving circuit 330 can include odd stages ST1 to ST(2n-1) which supply a gate pulse to odd gate lines GL1 to GL(2n-1) through a first connection line CL1 and can include even stages ST2 to ST(2n) which supply the gate pulse to even gate lines GL2 to GL(2n) through a second connection line CL2.

That is, the third gate driving circuit 330 can include the odd stages ST1 to ST(2n-1) corresponding to the total number of odd gate lines GL1 to GL(2n-1) and the even stages ST2 to ST(2n) corresponding to the total number of even gate lines GL2 to GL(2n). In detail, the third gate driving circuit 330 can receive first and second driving voltages VDD and VSS through a common signal line CGS passing through a fourth non-display area NA4, receive first, third, fifth, and seventh gate clocks CLK1, CLK3, CLK5, and CLK7 through an odd clock line CLK_ODD, and receive second, fourth, sixth, and eighth gate clocks CLK2, CLK4, CLK6, and CLK8 through an even clock line CLK_EVEN. Here, each of the first to eighth gate clocks CLK1 to CLK8 can have a phase which is sequentially shifted. In this case, the odd clock line CLK_ODD can transfer the first, third, fifth, and seventh gate clocks CLK1, CLK3, CLK5, and CLK7 to the odd stages ST1 to ST(2n-1), and the even clock line CLK_EVEN can transfer the second, fourth, sixth, and eighth gate clocks CLK2, CLK4, CLK6, and CLK8 to the even stages ST2 to ST(2n).

The odd stages ST1 to ST(2n-1) of the third gate driving circuit 330 can generate the same output signals Gout1 to Gout(2n-1) at the same timing as the odd stages ST1 to ST(2n-1) of the first gate driving circuit 310.

According to an embodiment, the odd stages ST1 to ST(2n-1) of the third gate driving circuit 330 can be connected to points of the odd gate lines GL1 to GL(2n-1) of the second display area AA2 through the first connection line CL1. Therefore, the odd stages ST1 to ST(2n-1) of the third gate driving circuit 330 can provide output signals Gout1 to Gout(2n-1) to the odd gate lines GL1 to GL(2n-1) of the second display area AA2 through the first connection line CL1.

The even stages ST2 to ST(2n) of the third gate driving circuit 330 can generate the same output signals Gout2 to Gout(2n) at the same timing as the even stages ST2 to ST(2n) of the second gate driving circuit 320.

According to an embodiment, the even stages ST2 to ST(2n) of the third gate driving circuit 330 can be connected to points of the even gate lines GL2 to GL(2n) of the first display area AA1 through the second connection line CL2. Therefore, the even stages ST2 to ST(2n) of the third gate driving circuit 330 can provide output signals Gout2 to Gout(2n) to the even gate lines GL2 to GL(2n) of the first display area AA1 through the second connection line CL2.

Figure 6:
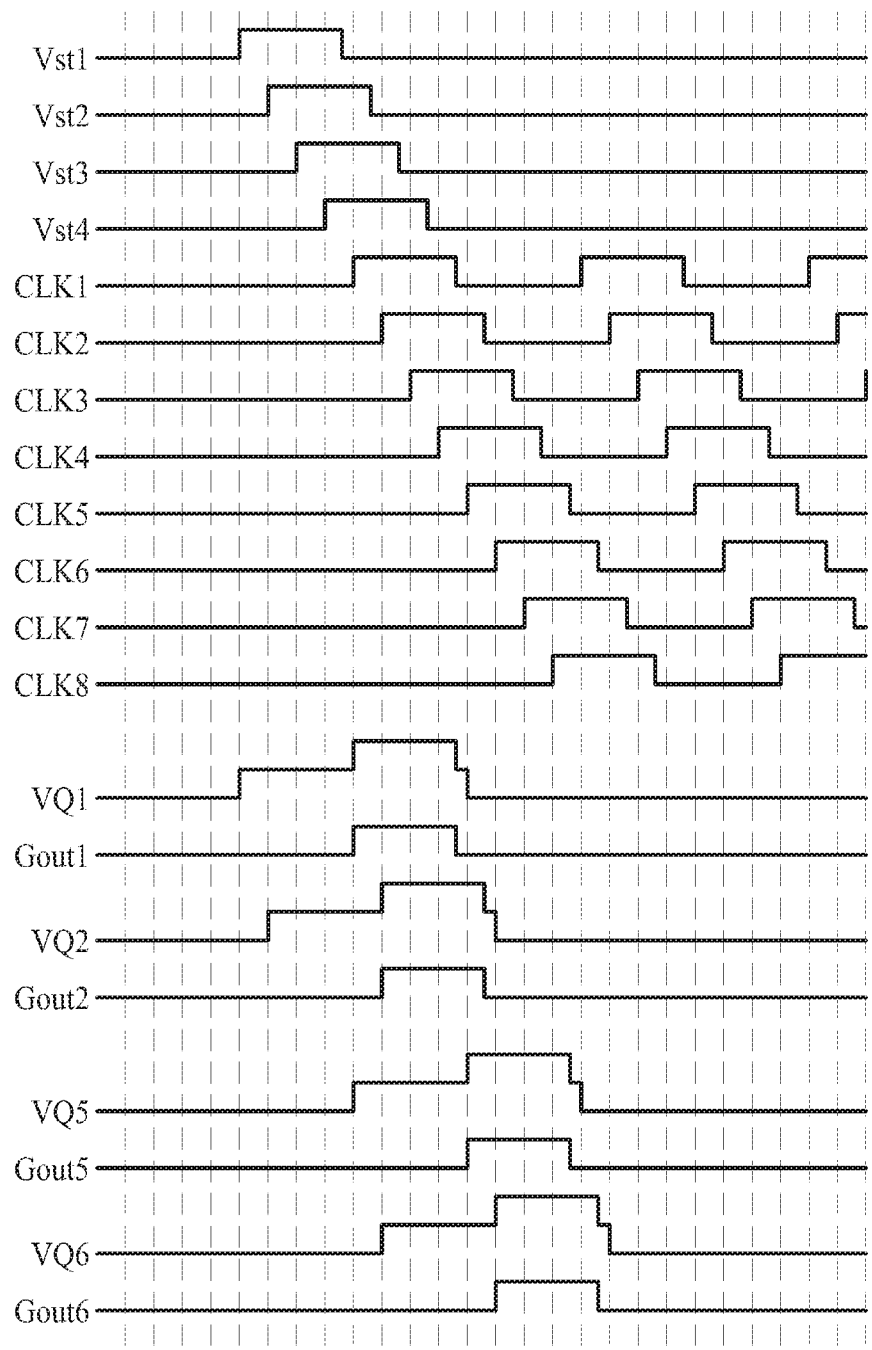
FIG. 6 is a waveform diagram showing a gate start signal, a gate shift clock, and a common gate signal in the display apparatus illustrated in FIG. 2.
Figure 7:
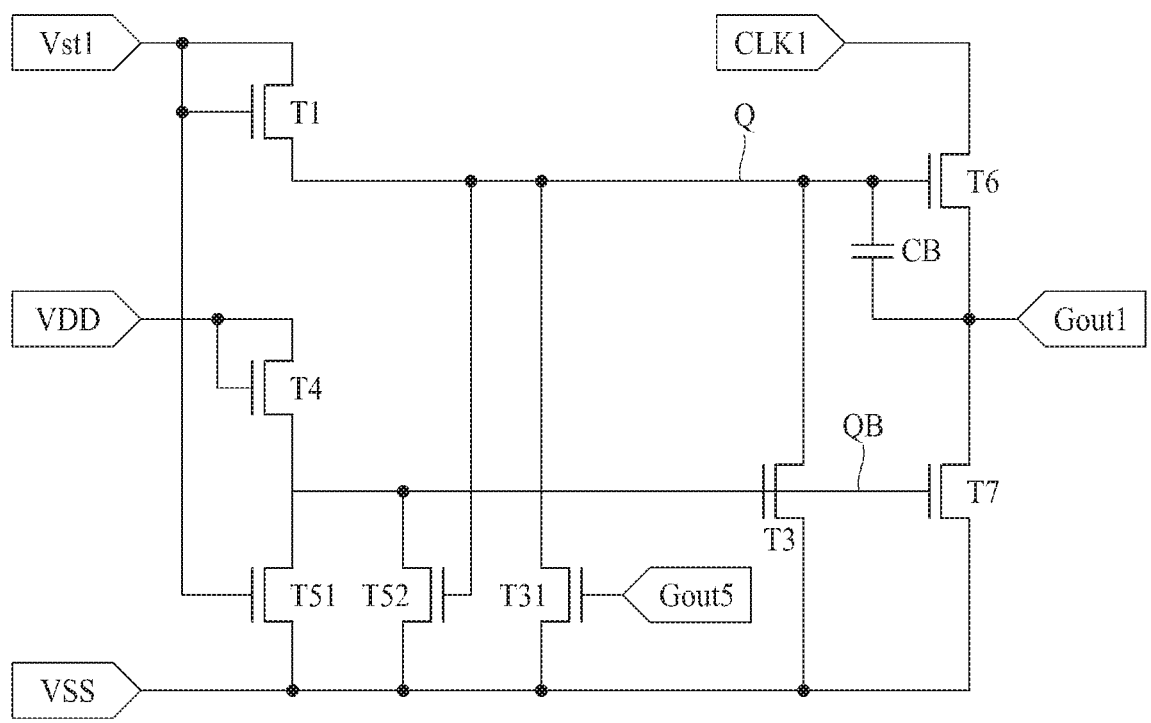
FIG. 7 is a circuit diagram illustrating an internal configuration of a first stage illustrated in FIG. 3.

FIG. 6 is a waveform diagram showing a gate start signal, a gate shift clock, and a common gate signal in the display apparatus illustrated in FIG. 2. FIG. 7 is a circuit diagram illustrating an internal configuration of a first stage illustrated in FIG. 3.

Referring to FIGS. 6 and 7, a first stage ST1 can include a first TFT T1, a third TFT T3, a thirty-first TFT T31, a fourth TFT T4, a fifty-first TFT T51, a fifty-second TFT T52, a sixth TFT T6, a seventh TFT T7, and a boot capacitor CB.

The first TFT T1 can include a gate terminal which receives a first gate start signal Vst1, a first terminal which receives the first gate start signal Vst1, and a second terminal connected to a first node Q. That is, the first TFT T1 can be turned on based on the first gate start signal Vst1 and can provide the first gate start signal Vst1 to the first node Q. Here, the first node Q can be connected to a gate terminal of the sixth TFT T6, and the first stage ST1 can provide an output signal (or a gate pulse) Gout1 to a first gate line GL1 on the basis of a voltage of the first node Q. Also, the output signal Gout1 can be supplied as a gate start signal of a next fourth stage.

According to an embodiment, first TFTs T1 of second to fourth stages ST2 to ST4 can be turned on based on second to fourth gate start signals Vst2 to Vst4, respectively, and the second to fourth stages ST2 to ST4 can respectively provide the second to fourth gate start signals Vst2 to Vst4 to first nodes Q. Also, a first TFT T1 of an i$^{th}$ stage STi (where i is a natural number from five to 2n) can be turned on based on an output signal Gout(i−4) of a previous fourth stage and can provide the output signal Gout(i−4) of the previous fourth stage to a first node Q.

The third TFT T3 can include a gate terminal connected to a second node QB, a first terminal connected to the first node Q, and a second terminal which receives the second driving voltage VSS. That is, the third TFT T3 can be turned on based on a voltage of the second node QB and can discharge the voltage of the first node Q to the second driving voltage VSS. Here, a voltage of the second node QB can be a voltage opposite to the voltage of the first node Q.

The thirty-first TFT T31 can include a gate terminal which receives an output signal Gout5 of the fifth stage ST5 or an output signal of a next fourth stage, a first terminal connected to the first node Q, and a second terminal which receives the second driving voltage VSS. That is, the thirty-first TFT T31 can be turned on based on the output signal Gout5 of the fifth stage ST5 and can discharge the voltage of the first node Q to the second driving voltage VSS.

According to an embodiment, a thirty-first TFT T31 of a j$^{th}$ stage STj (where j is a natural number from one to 2n-4) can be turned on based on an output signal Gout(j+4) of a next fourth stage and can discharge a voltage of a first node Q to the second driving voltage VSS. Also, a thirty-first TFT T31 of each of 2n-3$^{th}$ to 2n$^{th}$ stages ST(2n-3) to ST2n can be turned on by first to fourth reset clocks and can discharge a voltage of a first node Q to the second driving voltage VSS.

As described above, a plurality of stages of the gate driver 300 can each include a third TFT T3 and a thirty-first TFT T31, and thus, can include a plurality of routes through which the voltage of the first node Q is discharged. Accordingly, a discharging characteristic of the voltage of the first node Q can be enhanced, thereby enhancing the reliability of the gate driver 300.

The fourth TFT T4 can include a gate terminal which receives the first driving voltage VDD, a first terminal which receives the first driving voltage VDD, and a second terminal connected to the second node QB. That is, the fourth TFT T4 can be turned on based on the first driving voltage VDD and can provide the first driving voltage VDD to the second node QB.

The fifty-first TFT T51 can include a gate terminal which receives the first gate start signal Vst1, a first terminal connected to the second node QB, and a second terminal connected to the second driving voltage VSS. That is the fifty-first TFT T51 can be turned on based on the first gate start signal Vst1 and can discharge the voltage of the second node QB to the second driving voltage VSS.

According to an embodiment, fifty-first TFTs T51 of the second to fourth stages ST2 to ST4 can be respectively turned on based on second to fourth gate start signals Vst2 to Vst4 and can each discharge a voltage of a second node QB to the second driving voltage VSS. Also, a fifty-first TFTs T51 of an $i^{th}$ stage STi (where i is a natural number from five to 2n) can be turned on based on an output signal Gout(i−4) of a previous fourth stage and can discharge a voltage of a second node QB to the second driving voltage VSS.

The fifty-second TFT T52 can include a gate terminal connected to the first node Q, a first terminal connected to the second node QB, and a second terminal connected to the second driving voltage VSS. That is, the fifty-second TFT T52 can be turned on based on the voltage of the first node Q and can discharge the voltage of the second node QB to the second driving voltage VSS.

As described above, the plurality of stages ST1 to ST2n of the gate driver 300 can each include a fifty-first TFT T51 and a fifty-second TFT T52, and thus, can include a plurality of routes through which the voltage of the second node QB is discharged. Accordingly, a discharging characteristic of the voltage of the second node QB can be enhanced, thereby enhancing the reliability of the gate driver 300.

The sixth TFT T6 can include a gate terminal connected to the first node Q, a first terminal which receives a first gate clock CLK1, and a second terminal connected to an output node. That is, the sixth TFT T6 can be turned on based on the voltage of the first node Q and can provide an output signal (or a gate pulse) Gout1 to the first gate line GL1. Also, the output signal Gout1 can be supplied as a gate start signal of a next fourth stage.

The seventh TFT T7 can include a gate terminal connected to the second node QB, a first terminal connected to an output node, and a second terminal connected to the second driving voltage VSS. That is, the seventh TFT T7 can be turned on based on the voltage of the second node QB and can discharge a voltage of the output node to the second driving voltage VSS.

Moreover, one end of the boot capacitor CB can be connected to the first node Q, and the other end of the boot capacitor CB can be connected to the output node. Accordingly, the boot capacitor CB can store a difference voltage between the first node Q and the output node.

Hereinafter, an operation of a first stage ST1 according to an embodiment of the present disclosure will be described with reference to FIGS. 6 and 7.

First, when a first gate start signal Vst1 has a high level, a first TFT T1 and a fifty-first TFT T51 of a first stage ST1 can be turned on. Therefore, a voltage VQ1 of a first node Q which is one end of a boot capacitor CB can be precharged with a first driving voltage VDD supplied through the first TFT T1, and a voltage of a second node QB can be discharged to a second driving voltage VSS through the fifty-first TFT T51. Here, a rising time of a first gate clock CLK1 can be delayed by four horizontal periods compared to a rising time of the first gate start signal Vst1, and the first gate start signal Vst1 can maintain a high level until before the rising time of a first gate clock CLK1. Therefore, a sixth TFT T6 can be turned on based on the first gate start signal Vst1 which has a high level and is charged into the first node Q and can provide the first gate clock CLK1 having a low level to a first gate line GL1 through an output node. At this time, the voltage of the second node QB can be discharged to the second driving voltage VSS through each of the fifty-first TFT T51 and a fifty-second TFT T52, and a seventh TFT T7 can maintain a turn-off state.

Subsequently, when the first gate start signal Vst1 has a low level and the first gate clock CLK1 has a high level, the first gate clock CLK1 can be applied to the output node, which is the other end of the boot capacitor CB, through the sixth TFT T6 which is still in a turn-on state. Therefore, the first node Q which is the one end of the boot capacitor CB can be bootstrapped to have a high-level voltage which is higher. Accordingly, the sixth TFT T6 can be put in a complete turn-on state and can provide the first gate clock CLK1 to the first gate line GL1 as a first gate pulse Gout1 without the loss of a voltage. At this time, the voltage of the second node QB can be discharged to the second driving voltage VSS through each of the fifty-first TFT T51 and the fifty-second TFT T52, and the seventh TFT T7 can maintain a turn-off state.

Finally, when an output signal Gout5 having a high level is supplied from a fifth stage ST5 or a next fourth stage to a gate terminal of a thirty-first TFT T31, the thirty-first TFT T31 can be turned on and can discharge the voltage VQ1 of the first node Q to the second driving voltage VSS. Therefore, the sixth TFT T6 can be turned off and may not provide the first gate clock CLK1 to the output node, and the fifty-second TFT T52 can be turned off and may not discharge the voltage of the second node QB to the second driving voltage VSS. Accordingly, the voltage of the second node QB can have a high level on the basis of the first driving voltage VDD supplied through the fourth TFT T4, and the seventh TFT T7 can be turned on and can discharge a voltage of the output node to the second driving voltage VSS. As a result, when the voltage of the output node is discharged to the second driving voltage VSS, the first stage ST1 can supply a gate-off voltage to the first gate line GL1.

Moreover, except for that the above-given descriptions (for example, second to fourth gate start signals Vst2 to Vst4 and first to fourth clocks), a configuration and an operation of each of second to $2n^{th}$ stages ST2 to ST2n are the same as the above-described first stage ST1, and thus, their descriptions are omitted.

Figure 8:
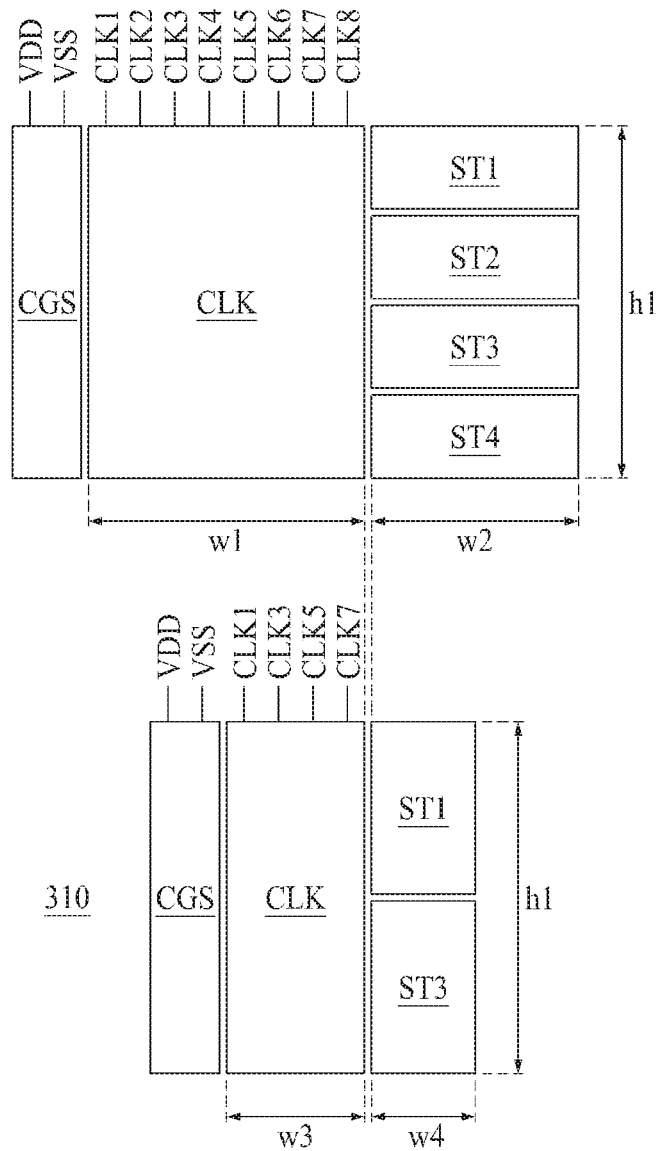
FIG. 8 is a diagram for describing an effect of decreasing a non-display area in the display apparatus illustrated in FIG. 2.
Figure 9:
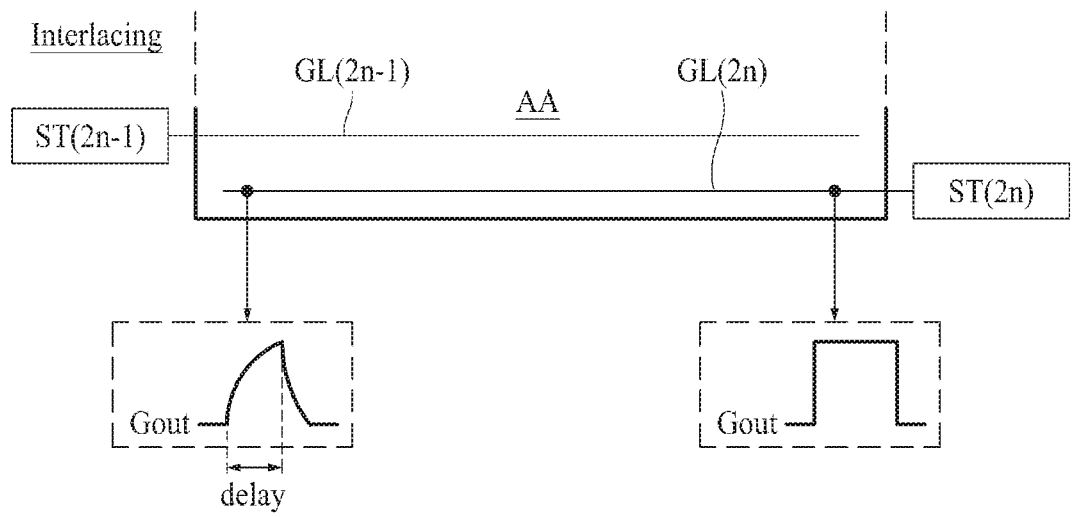
FIG. 9 is a diagram for describing an effect of decreasing the delay of a gate pulse in the display apparatus illustrated in FIG. 2.
Figure 9:
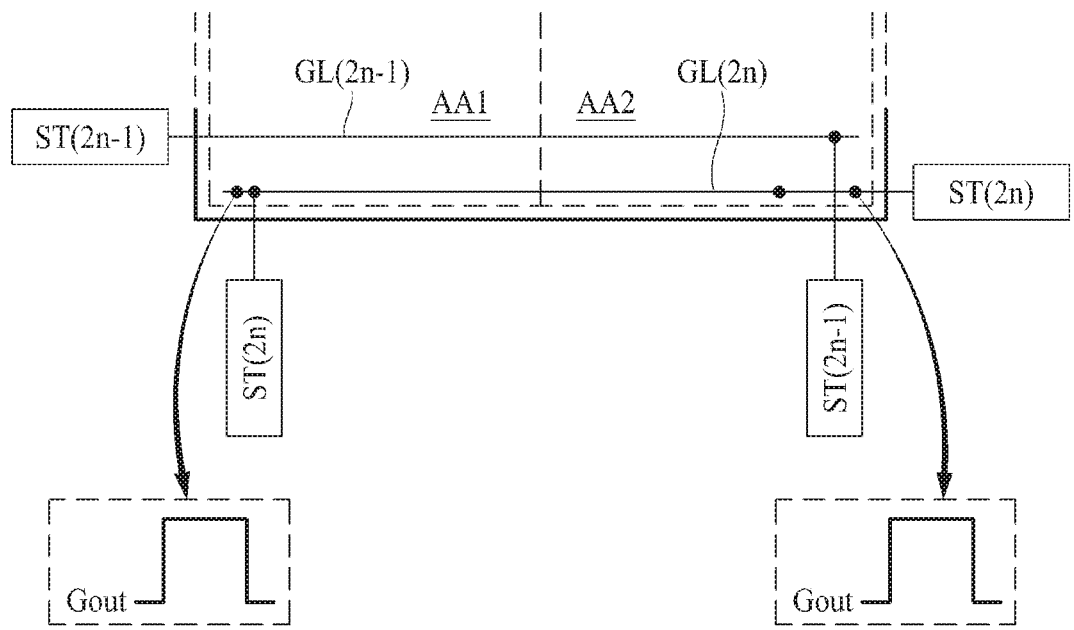

FIG. 8 is a diagram for describing an effect of decreasing a bezel area in the display apparatus illustrated in FIG. 2. FIG. 9 is a diagram for describing an effect of decreasing the delay of a gate pulse in the display apparatus illustrated in FIG. 2.

Referring to FIGS. 8 and 9, in a related art display apparatus having a large display panel, a gate pulse is supplied to a plurality of gate lines by using a double feeding method or an interlacing method.

In FIG. 8, in a related art display apparatus driven by the double feeding method, a plurality of stages are disposed in each of a left non-display area and a right non-display area of a substrate. In this case, the related art display apparatus has a problem where the left non-display area and the right non-display area increase due to a width w1 of a clock line CLK including first to eighth gate clocks CLK1 to CLK8 and a width w2 of each of the plurality of stages. The related art display apparatus has a problem where a non-display area increases as a gate driver is driven at a high speed (or a high frequency).

In order to solve such a problem, in a display apparatus 10 according to the present disclosure, odd stages ST1 to ST(2n-1) of a first gate driving circuit 310 can be disposed in a left edge (or a second non-display area NA2) of a display panel 100, even stages ST2 to ST(2n) of a second gate driving circuit 320 can be disposed in a right edge (or a third non-display area NA3) of the display panel 100, and odd stages ST1 to ST(2n-1) and even stages ST2 to ST(2n) of a third gate driving circuit 330 can be disposed in a lower edge (or a fourth non-display area NA4) of the display panel 100. Accordingly, in the first gate driving circuit 310, a width w3 of a clock line CLK including first, third, fifth, and seventh gate clocks CLK1, CLK3, CLK5, and CLK7 and a width w4 of each of the odd stages ST1 to ST(2n-1) can decrease compared to the related art display apparatus.

For example, in the related art display apparatus driven by the double feeding method, a second width w2 increases in order for first to fourth stages ST1 to ST4 to be provided in a certain interval h1. On the other hand, in the first gate driving circuit 310 according to the present disclosure, the width w4 of each of the odd stages ST1 and ST3 can be reduced by decreasing the number of stages provided in the certain interval h1. Accordingly, in the first gate driving circuit 310 according to the present disclosure, since only the odd stage ST1 and ST3 are provided in the certain interval h1, a non-display area can decrease even in a case which drives a large display panel.

In FIG. 9, in a related art display apparatus driven by the interlacing method, an odd-numbered stage ST(2n-1) of the plurality of stages is disposed in the left non-display area of the substrate, and an even-numbered stage ST(2n) of the plurality of stages is disposed in the right non-display area of the substrate. In this case, the related art display apparatus including a large display panel has a problem where a gate clock Gout is delayed as a gate line GL(2n) becomes farther away from a stage. Therefore, in the related art display apparatus, an output difference between one end of the gate line GL(2n) directly receiving a gate clock from a stage and the other end of the gate line GL(2n) farther away from the stage occurs. Also, in the related art display apparatus, delay occurs in the gate clock Gout, causing a problem where an image defect occurs in high speed driving (or high frequency driving)

In order to solve such a problem, in the display apparatus 10 according to the present disclosure, odd stages ST1 to ST(2n-1) of the first gate driving circuit 310 can be disposed in one end of a first display area AA1, and odd stages ST1 to ST(2n-1) of the third gate driving circuit 330 can be disposed in the other end of a second display area AA2. Also, in the display apparatus 10 according to the present disclosure, even stages ST2 to ST(2n) of the second gate driving circuit 320 can be disposed in one end of the second display area AA2, and even stages ST2 to ST(2n) of the third gate driving circuit 330 can be disposed in the other end of the first display area AA1.

Therefore, the odd stages ST1 to ST(2n-1) of the first gate driving circuit 310 can directly supply a gate pulse to one ends of odd gate lines GL1 to GL(2n-1), and the odd stages ST1 to ST(2n-1) of the third gate driving circuit 330 can supply the gate pulse to points of the odd gate lines GL1 to GL(2n-1) of the second display area AA2 through a first connection line CL1. In this manner, the even stages ST2 to ST(2n) of the second gate driving circuit 320 can directly supply the gate pulse to one ends of even gate lines GL2 to GL(2n), and the even stages ST2 to ST(2n) of the third gate driving circuit 330 can supply the gate pulse to points of the even gate lines GL2 to GL(2n) of the first display area AA1 through a second connection line CL2.

Therefore, the display apparatus 10 according to the present disclosure can prevent delay from occurring in the gate clock Gout, thereby preventing an output difference from occurring between both ends of the gate line GL(2n). Accordingly, the display apparatus 10 according to the present disclosure can prevent delay from occurring in high speed driving (or high frequency driving), and thus, can easily perform the high speed driving of a large display panel, thereby enhancing image quality.

As a result, since the display apparatus 10 according to the present disclosure includes the first to third gate driving circuits 310 to 330, the left bezel area and the right bezel area can be reduced, and the delay of the gate pulse may not occur, thereby easily realizing high speed driving. In other words, in the display apparatus 10 according to the present disclosure, since the first to third gate driving circuits 310 to 330 are individually and respectively disposed in the second to fourth non-display areas NA2 to NA4 except the first non-display area NA1 with the pad part provided therein, an area of each of the second and third non-display areas NA2 and NA3 can be reduced, and an output difference between gate pulses can be prevented from occurring in the display area AA.

Figure 10:
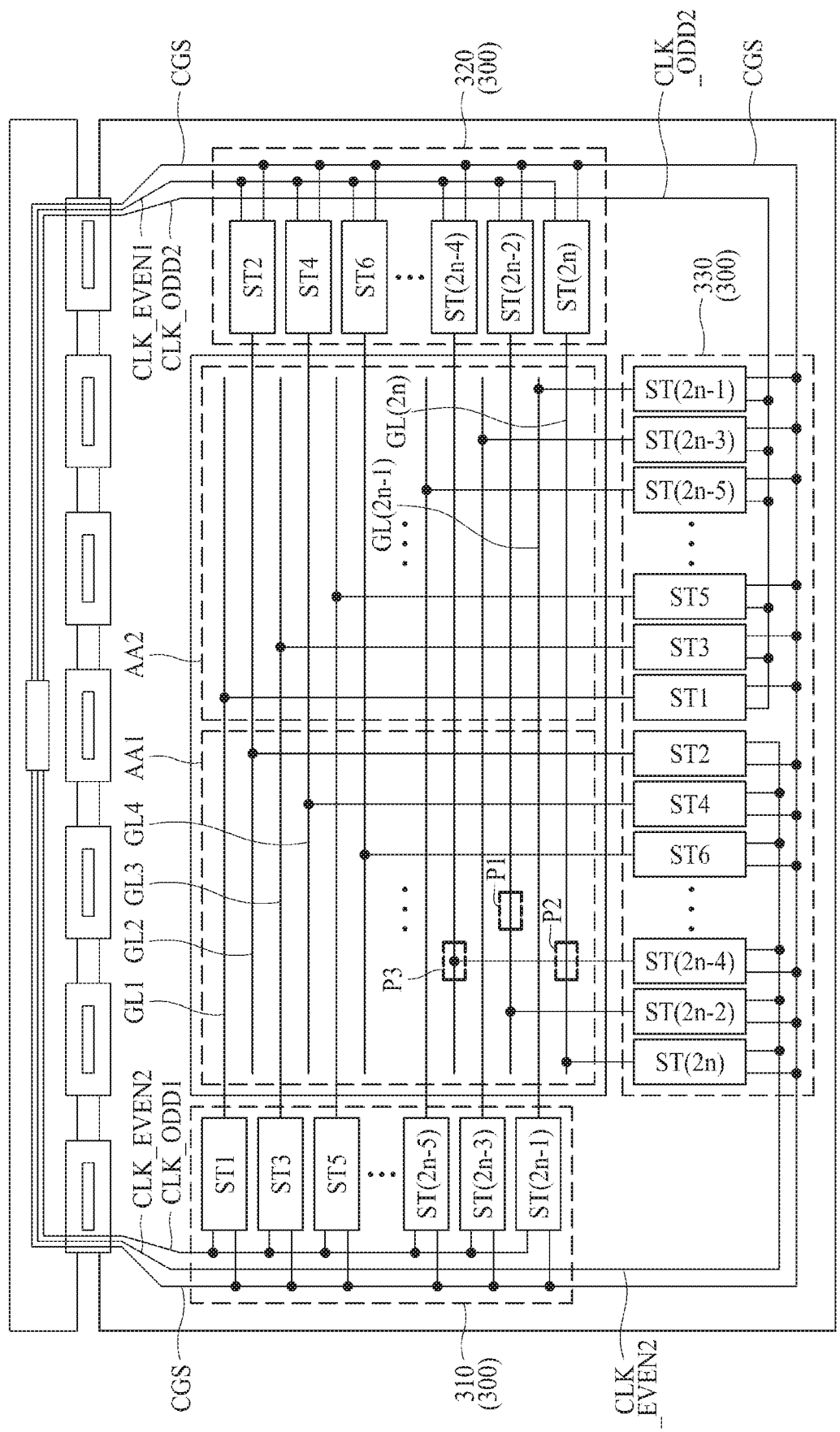
FIG. 10 is a diagram illustrating a connection relationship between a plurality of stages and a plurality of gate lines in a display apparatus according to a second embodiment of the present disclosure.
Figure 11:
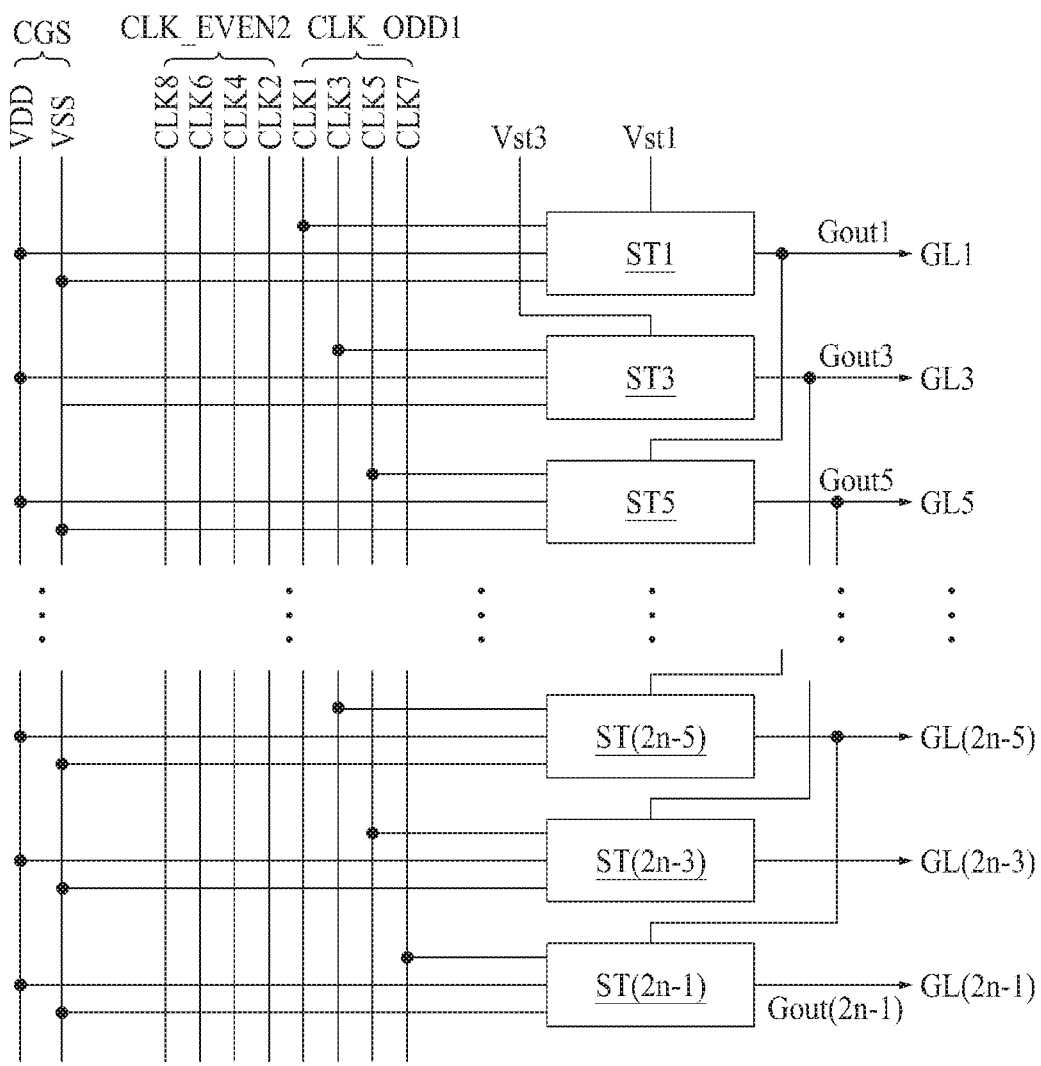
FIG. 11 is a diagram illustrating a first gate driving circuit in the display apparatus illustrated in FIG. 10.
Figure 12:
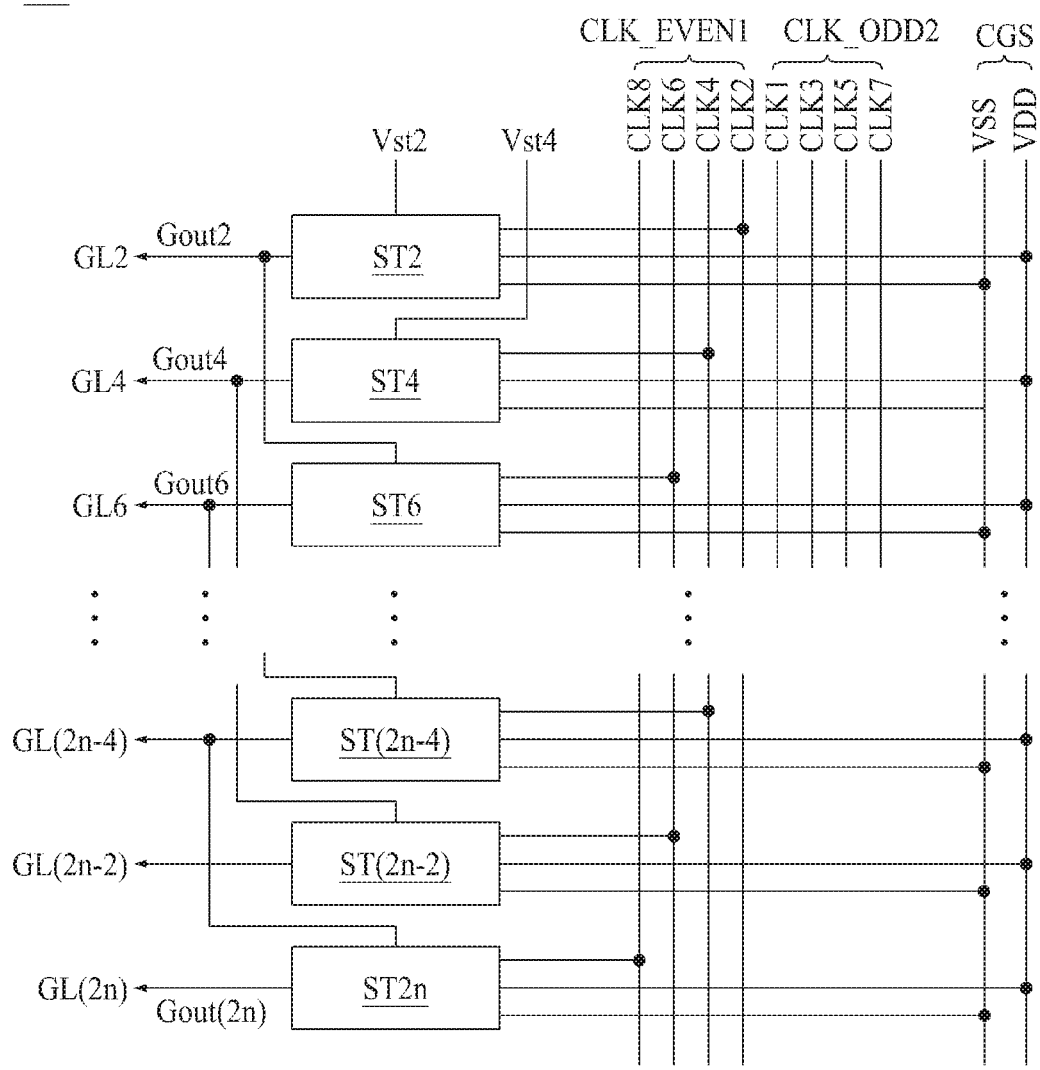
FIG. 12 is a diagram illustrating a second gate driving circuit in the display apparatus illustrated in FIG. 10.
Figure 13:
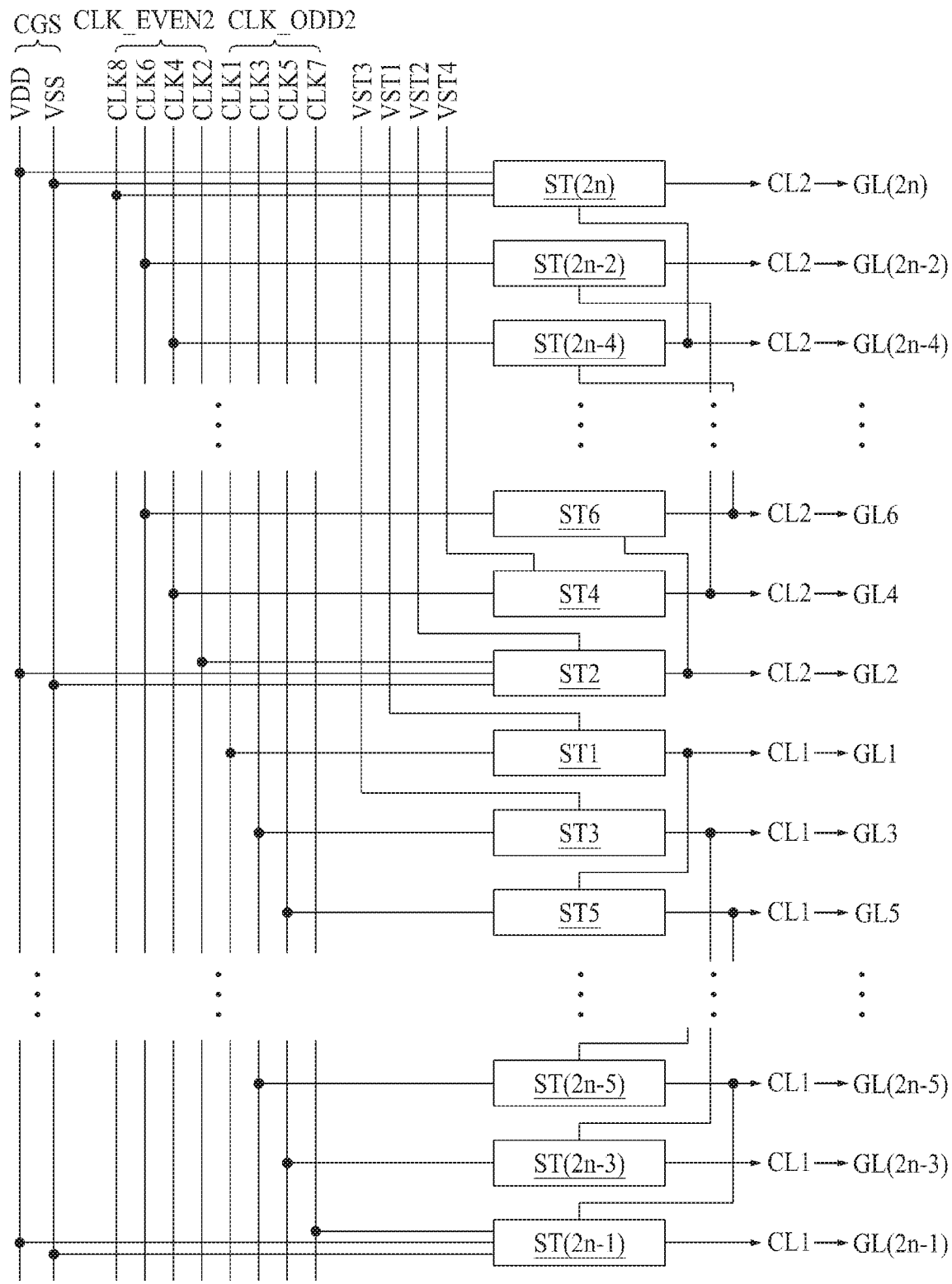
FIG. 13 is a diagram illustrating a third gate driving circuit in the display apparatus illustrated in FIG. 10.

FIG. 10 is a diagram illustrating a connection relationship between a plurality of stages and a plurality of gate lines in a display apparatus according to a second embodiment. FIG. 11 is a diagram illustrating a first gate driving circuit in the display apparatus illustrated in FIG. 10. FIG. 12 is a diagram illustrating a second gate driving circuit in the display apparatus illustrated in FIG. 10. FIG. 13 is a diagram illustrating a third gate driving circuit in the display apparatus illustrated in FIG. 10. Here, a display apparatus according to a second embodiment illustrated in FIGS. 10 to 13 can be implemented by modifying only configurations of first and second odd clock lines CLK_ODD1 and CLK_ODD2 and first and second even clock lines CLK_EVEN1 and CLK_EVEN2, and thus, the same configuration as the above-described configuration will be briefly described or is omitted.

Referring to FIGS. 10 to 13, the first odd clock line CLK_ODD1 can extend from a display driver 200 to a second non-display area NA2 and can be connected to odd stages ST1 to ST(2n-1) of a first gate driving circuit 310.

The second odd clock lines CLK_ODD2 can pass through a third non-display area NA3 and can extend from the display driver 200 to a fourth non-display area NA4 and can be connected to odd stages ST1 to ST(2n-1) of a third gate driving circuit 330.

The first even clock line CLK_EVEN1 can extend from the display driver 200 to the third non-display area NA3 and can be connected to even stages ST2 to ST(2n) of a second gate driving circuit 320.

The second even clock lines CLK_EVEN2 can pass through the second non-display area NA2 and can extend from the display driver 200 to the fourth non-display area NA4 and can be connected to even stages ST2 to ST(2n) of a third gate driving circuit 330.

As described above, since the display apparatus 10 according to the second embodiment is implemented by modifying a configuration of each clock line of the display apparatus according to the first embodiment, a load of each clock line can be reduced, and the first to eighth gate clocks CLK1 to CLK8 can be easily transferred to each stage of the gate driver 300.

Figure 14:
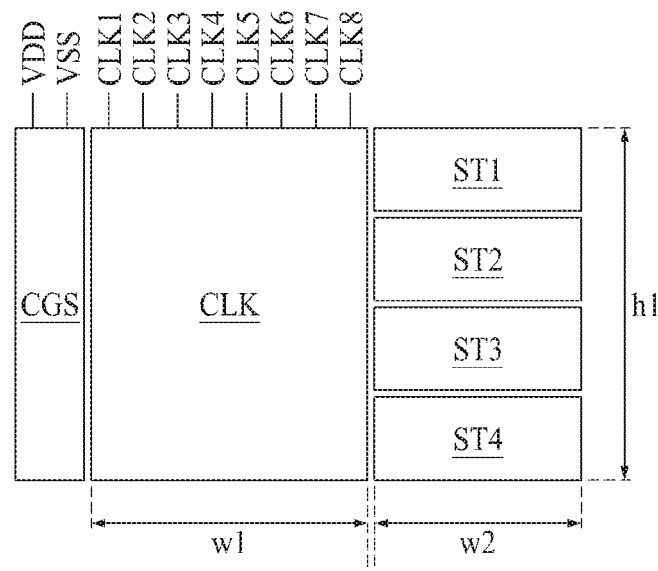
FIG. 14 is a diagram for describing an effect of decreasing a non-display area in the display apparatus illustrated in FIG. 10.
Figure 14:
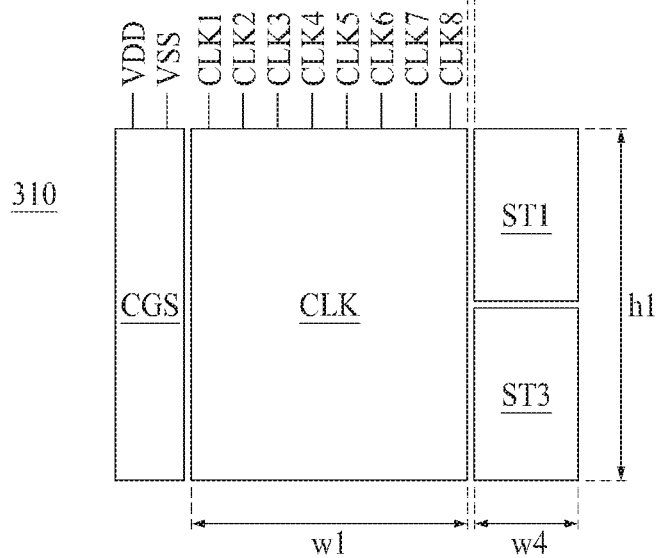

FIG. 14 is a diagram for describing an effect of decreasing a non-display area in the display apparatus illustrated in FIG. 10.

Referring to FIG. 14, in the related art display apparatus driven by the double feeding method, a plurality of stages are disposed in each of a left non-display area and a right non-display area of a substrate. In this case, the related art display apparatus has a problem where the left non-display area and the right non-display area increase due to a width w1 of a clock line CLK including first to eighth gate clocks CLK1 to CLK8 and a width w2 of each of the plurality of stages. The related art display apparatus has a problem where a non-display area increases as a gate driver is driven at a high speed (or a high frequency).

In order to solve such a problem, in a display apparatus 10 according to the present disclosure, odd stages ST1 to ST(2n-1) of a first gate driving circuit 310 can be disposed in a left edge (or a second non-display area NA2) of a display panel 100, even stages ST2 to ST(2n) of a second gate driving circuit 320 can be disposed in a right edge (or a third non-display area NA3) of the display panel 100, and odd stages ST1 to ST(2n-1) and even stages ST2 to ST(2n) of a third gate driving circuit 330 can be disposed in a lower edge (or a fourth non-display area NA4) of the display panel 100. Accordingly, in the first gate driving circuit 310, a width w4 of each of the odd stages ST1 to ST(2n-1) can decrease compared to the related art display apparatus.

As a result, since the display apparatus 10 according to the present disclosure includes the first to third gate driving circuits 310 to 330, the left non-display area and the right non-display area can be reduced, and the delay of the gate pulse may not occur, thereby easily realizing high speed driving. In other words, in the display apparatus 10 according to the present disclosure, since the first to third gate driving circuits 310 to 330 are individually and respectively disposed in the second to fourth non-display areas NA2 to NA4 except the first non-display area NA1 with the pad part provided therein, an area of each of the second and third non-display areas NA2 and NA3 can be reduced, and an output difference between gate pulses can be prevented from occurring in the display area AA.

Moreover, when the display panel 100 is a liquid crystal display panel, the lower substrate including transistors can be exposed at the outside of the display apparatus 10, and thus, a width of a bezel of a front cover which covers or supports the first to fourth non-display areas can be reduced.

For example, generally, a pad part provided in the first non-display area can be provided on the lower substrate, an upper substrate can be bonded to the lower substrate with a liquid crystal therebetween, and the upper substrate can be exposed at the outside of the display apparatus. That is, a user who uses the display apparatus can see an image displayed through the upper substrate. In this case, since the pad part should be exposed, a size of the upper substrate can be implemented to be less than that of the lower substrate. Therefore, the pad part can also be exposed in a direction capable of being seen by the user, and thus, the pad part can be covered by the front cover so as not to be seen by the user. Accordingly, according to the present disclosure, even when an area of each of the second to fourth non-display areas is reduced, an area of the first non-display area may not decrease, and particularly, a width of the bezel of the front cover which covers the first non-display area may not be reduced.

However, when the lower substrate is disposed in an external direction (i.e., a direction seen by the user) of the display apparatus 10 and the upper substrate is provided in an internal direction (i.e., a direction toward a backlight unit) of the display apparatus 10, a width of the bezel of the front cover which covers or supports the first non-display area can be reduced.

That is, according to the above-described arrangement structure according to the present disclosure, even when a size of the first non-display area is not substantially reduced, the pad part may not be exposed in the external direction of the display apparatus 10, and thus, a width of the bezel of the front cover for covering the first non-display area with the pad part provided therein can decrease. In this case, according to the present disclosure, since an area of each of the second and third non-display areas is reduced, widths of bezels of front covers which respectively cover or support the second and third non-display areas can be reduced. Accordingly, according to the present disclosure, widths of the bezels of the front covers which respectively cover or support the first to fourth non-display areas can be reduced. Hereinafter, this will be described in detail with reference to FIGS. 20 to 22.

In the following description, a generic name for the first connection line CL1 and the second connection line CL2 can be a connection line CL. Hereinafter, a connection structure of a gate line and a connection line will be described. In the following description, descriptions which are the same as or similar to descriptions given above are omitted or will be briefly given.

Figure 15:
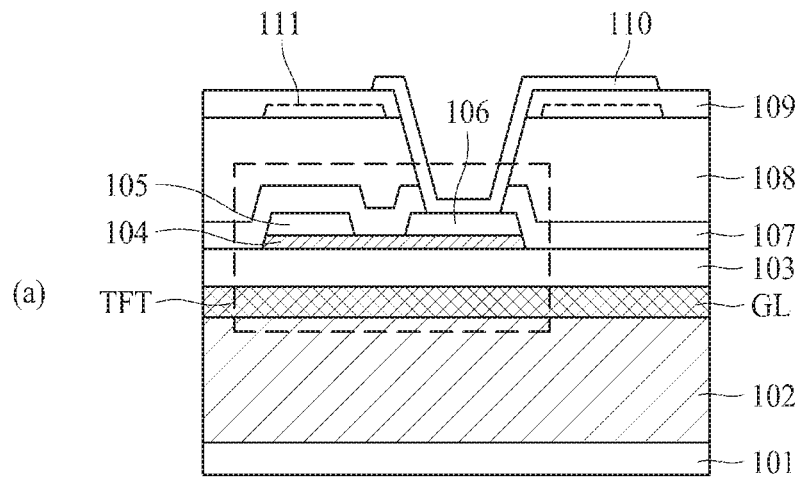
FIG. 15 is an exemplary diagram schematically illustrating a cross-sectional surface of a display panel illustrated in FIGS. 2 and 10.
Figure 15:
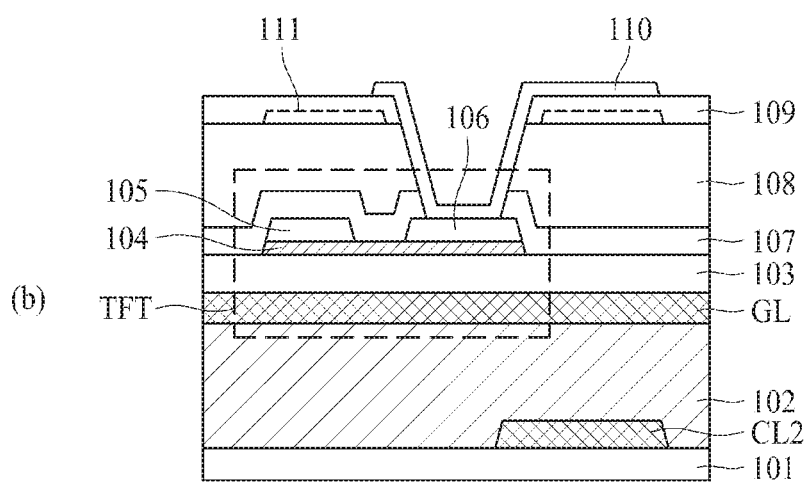
Figure 15:
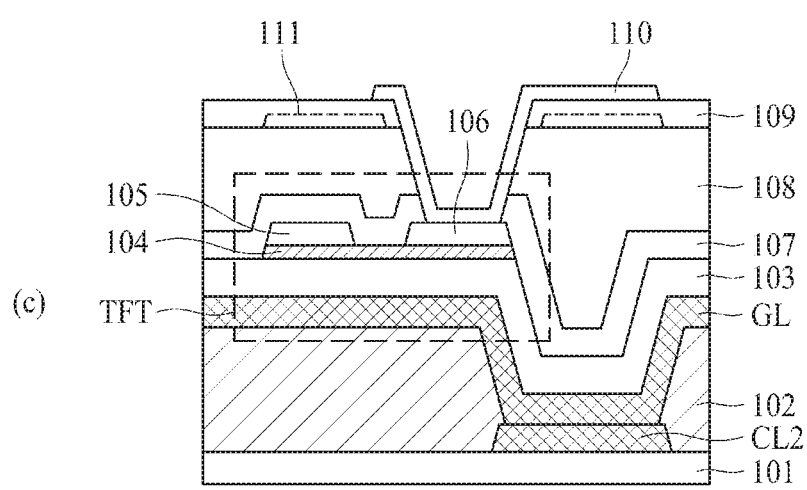

FIG. 15 is an exemplary diagram schematically illustrating a cross-sectional surface of the display panel illustrated in FIGS. 2 and 10. Particularly, (a) of FIG. 15 schematically illustrates a cross-sectional surface taken along the first pixel P1 illustrated in FIGS. 2 and 10 in parallel with the gate line GL, (b) of FIG. 15 schematically illustrates a cross-sectional surface taken along the second pixel P2 illustrated in FIGS. 2 and 10 in parallel with the gate line GL, and (c) of FIG. 15 schematically illustrates a cross-sectional surface taken along the third pixel P3 illustrated in FIGS. 2 and 10 in parallel with the gate line GL. For convenience of description, in the cross-sectional surfaces illustrated in (a), (b), and (c), elements which are not directly illustrated in the cross-sectional surfaces are illustrated. To provide an additional description, the cross-sectional surfaces illustrated in (a), (b), and (c) are for describing an arrangement structure of the gate line GL and the second connection line CL2, and the other elements are schematically illustrated for convenience of description.

First, referring to (a) of FIG. 15, since the first pixel P1 includes only the gate line GL as illustrated in FIGS. 2 and 10, the second connection line CL2 is not included in the cross-sectional surface of the first pixel P1.

In this case, as illustrated in (a) of FIG. 15, the first pixel P1 of the display panel 100 can include a substrate 101, a high heat-resistant planarization layer 102 provided on the substrate 101, a gate line GL provided on the high heat-resistant planarization layer 102, a gate insulation layer 103 provided on the gate line GL, a semiconductor 104 provided on the gate insulation layer 103 to overlap the gate line GL, a first electrode 105 provided on the semiconductor 104, a second electrode 106 provided on the semiconductor 104 so as to be apart from the first electrode 105, a passivation layer 107 covering the first electrode 105, the second electrode 106, and the semiconductor 104, a planarization layer 108 provided on the passivation layer 107, and a pixel electrode 110 provided on the planarization layer 108 and electrically connected to the second electrode 106 through a contact hole formed in the planarization layer 108.

When the display panel 100 is a liquid crystal display panel, as illustrated in FIG. 15, a common electrode 111 can be further provided on the planarization layer 108 and can be covered by an insulation layer 109. In this case, the pixel electrode 110 can be provided on the insulation layer 109 and can be electrically connected to the second electrode 106 through a contact hole which is formed in the insulation layer 109 and the planarization layer 108. The first electrode 105, the second electrode 106, the semiconductor 104, the gate insulation layer 103, and the gate line GL can each perform a function of a transistor (a TFT) (particularly, a switching transistor) for controlling a light transmittance of liquid crystal included in the liquid crystal display panel. Such description can be applied to a display panel 100 illustrated in (b) and (c) of FIG. 15.

When the display panel 100 is an organic light emitting display panel, the common electrode 111 and the insulation layer 109 can be omitted. In this case, the pixel electrode 110 can be an anode of an organic light emitting diode (OLED), a light emitting layer included in the OLED can be provided on the pixel electrode 110, and a cathode included in the OLED can be provided on the light emitting layer. The first electrode 105, the second electrode 106, the semiconductor 104, the gate insulation layer 103, and the gate line GL can each perform a function of a transistor (a TFT) (particularly, a driving transistor) for controlling the amount of light emitted from the OLED included in the organic light emitting display panel. Such description can be applied to the display panel 100 illustrated in (b) and (c) of FIG. 15.

Referring to (b) of FIG. 15, in the second pixel P2, the gate line GL can intersect with the second connection line CL2 as illustrated in FIGS. 2 and 10.

In this case, as illustrated in (b) of FIG. 15, the second pixel P2 of the display panel 100 can include a substrate 101, the second connection line CL2 provided on the substrate 101, a high heat-resistant planarization layer 102 covering the second connection line CL2, a gate line GL provided on the high heat-resistant planarization layer 102, a gate insulation layer 103 provided on the gate line GL, a semiconductor 104 provided on the gate insulation layer 103 to overlap the gate line GL, a first electrode 105 provided on the semiconductor 104, a second electrode 106 provided on the semiconductor 104 so as to be apart from the first electrode 105, a passivation layer 107 covering the first electrode 105, the second electrode 106, and the semiconductor 104, a planarization layer 108 provided on the passivation layer 107, and a pixel electrode 110 provided on the planarization layer 108 and electrically connected to the second electrode 106 through a contact hole formed in the planarization layer 108.

That is, in the present disclosure, as illustrated in (b), the first connection line CL1 and the second connection line CL2 can be provided on the substrate 101 and can be covered by the high heat-resistant planarization layer 102.

Finally, referring to (c) of FIG. 15, in the third pixel P3, the gate line GL can be connected to the second connection line CL2 as illustrated in FIGS. 2 and 10.

In this case, as illustrated in (c) of FIG. 15, the third pixel P3 of the display panel 100 can include a substrate 101, the second connection line CL2 provided on the substrate 101, a high heat-resistant planarization layer 102 covering the second connection line CL2, a gate line GL provided on the high heat-resistant planarization layer 102, a gate insulation layer 103 provided on the gate line GL, a semiconductor 104 provided on the gate insulation layer 103 to overlap the gate line GL, a first electrode 105 provided on the semiconductor 104, a second electrode 106 provided on the semiconductor 104 so as to be apart from the first electrode 105, a passivation layer 107 covering the first electrode 105, the second electrode 106, and the semiconductor 104, a planarization layer 108 provided on the passivation layer 107, and a pixel electrode 110 provided on the planarization layer 108 and electrically connected to the second electrode 106 through a contact hole formed in the planarization layer 108.

That is, in the present disclosure, as illustrated in (b) of FIG. 15, the first connection line CL1 and the second connection line CL2 can be provided on the substrate 101 and can be covered by the high heat-resistant planarization layer 102.

Particularly, as illustrated in (c) of FIG. 15, the second connection line CL2 can be connected to the gate line GL through a contact hole formed in the high heat-resistant planarization layer 102, and moreover, the first connection line CL1 can be connected to the gate line GL through a contact hole formed in the high heat-resistant planarization layer 102.

To provide an additional description, as illustrated in FIGS. 1, 2, and 10, the connection lines CL can extend in a direction (i.e., the second direction) from the fourth non-display area NA4 of the display panel 100 to the first non-display area NA1, and the gate lines GL can extend a direction (particularly, the first direction vertical to the second direction) which differs from the connection lines CL.

In this case, as illustrated in FIG. 15, the connection lines CL can be provided on the substrate 101, insulated from the gate line GL by the high heat-resistant planarization layer 102, and electrically connected to the gate line GL through a contact hole formed in the high heat-resistant planarization layer 102.

The reason that the connection lines CL are included in the substrate 101 and the substrate 101 is covered by the high heat-resistant planarization layer 102 as described above is for decreasing a load of the connection line CL and reducing a parasitic capacitance occurring between the connection line CL and at least one of various metals (for example, the first electrode 105, the second electrode 106, the common electrode 111, and the data line) included in the display panel 100.

Particularly, as a thickness of the high heat-resistant planarization layer 102 is thickened, an interval between metals provided on the high heat-resistant planarization layer 102 and the connection line CL can increase, and thus, a magnitude of a parasitic capacitance occurring between the connection line CL and the metals can decrease. That is, the high heat-resistant planarization layer 102 can perform a function of planarizing an upper end of the connection line CL and a function of decreasing the parasitic capacitance occurring between the connection line CL and other metals.

In this case, since the gate line GL, the semiconductor 104, the first electrode 105, and the second electrode 106 each requiring a high temperature process are provided on the high heat-resistant planarization layer 102, and thus, the high heat-resistant planarization layer 102 should use a high heat-resistant material.

Therefore, a relative dielectric constant of the high heat-resistant planarization layer 102 should be greater than 2 and less than 4, a uniformity (Max−Min) of the high heat-resistant planarization layer 102 should be greater than 0 and less than 0.2 µm, a weight loss of the high heat-resistant planarization layer 102 in a high temperature process performed on oxide at a temperature of more than 400° C. should be greater than 0.1% and less than 1%, the high heat-resistant planarization layer 102 should be chemically stable so that weight loss or deformation of a material characteristic does not occur due to metal etching, and a contact characteristic with a different layer should be good. That is, the weight loss, the relative dielectric constant, and the uniformity should be as small as possible.

Moreover, when a display panel including the high heat-resistant planarization layer 102 is a liquid crystal display panel, the high heat-resistant planarization layer 102 should have a transmittance of 70% to 100%.

That is, the high heat-resistant planarization layer 102 can include a material having a physical characteristic similar to that of silicon oxide ($SiO_2$).

Figure 16:
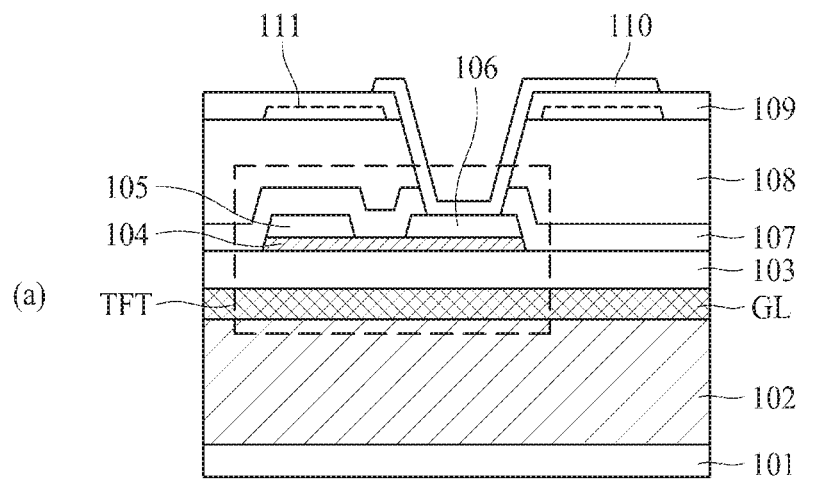
FIG. 16 is another exemplary diagram schematically illustrating the cross-sectional surface of the display panel illustrated in FIGS. 2 and 10.
Figure 16:
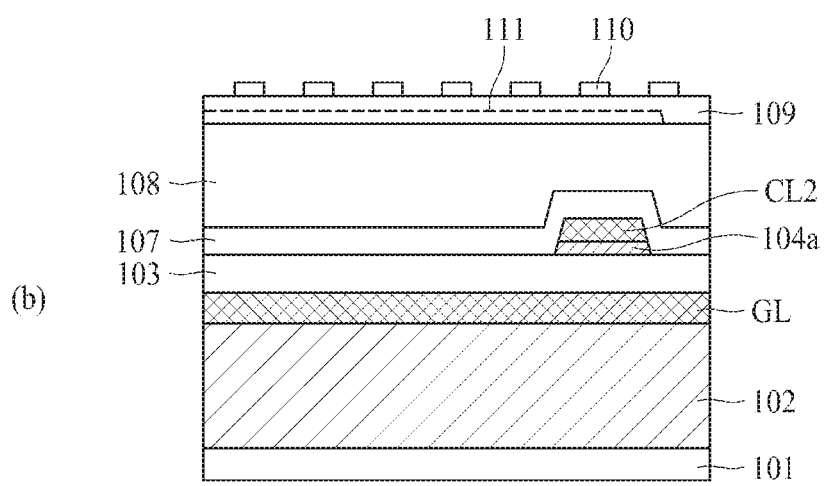
Figure 16:
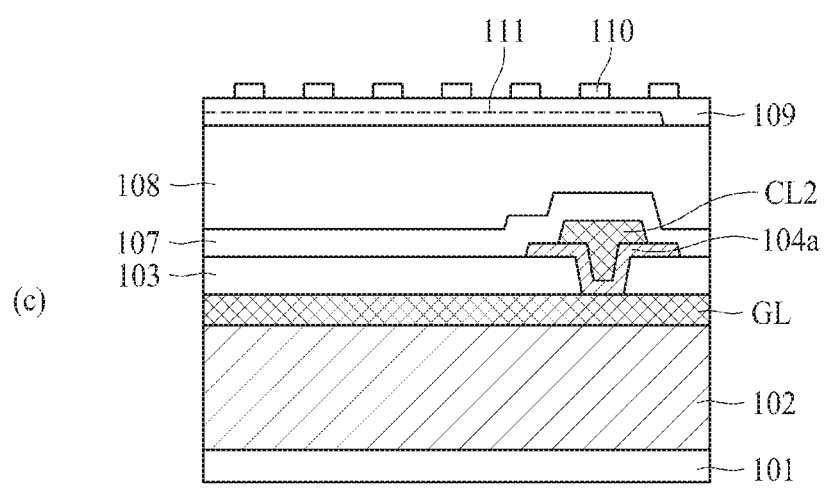

FIG. 16 is another exemplary diagram schematically illustrating the cross-sectional surface of the display panel illustrated in FIGS. 2 and 10. Particularly, (a) of FIG. 16 schematically illustrates a cross-sectional surface taken along the first pixel P1 illustrated in FIGS. 2 and 10 in parallel with the gate line GL, (b) of FIG. 16 schematically illustrates a cross-sectional surface taken along the second pixel P2 illustrated in FIGS. 2 and 10 in parallel with the gate line GL, and (c) of FIG. 16 schematically illustrates a cross-sectional surface taken along the third pixel P3 illustrated in FIGS. 2 and 10 in parallel with the gate line GL. For convenience of description, in the cross-sectional surfaces illustrated in (a), (b), and (c), elements which are not directly illustrated in the cross-sectional surfaces are illustrated. To provide an additional description, the cross-sectional surfaces illustrated in (a), (b), and (c) are for describing an arrangement structure of the gate line GL and the second connection line CL2, and the other elements are schematically illustrated for convenience of description.

First, referring to (a) of FIG. 16, since the first pixel P1 includes only the gate line GL as illustrated in FIGS. 2 and 10, the second connection line CL2 is not included in the cross-sectional surface of the first pixel P1.

In this case, as illustrated in (a) of FIG. 16, the first pixel P1 of the display panel 100 can include a substrate 101, a high heat-resistant planarization layer 102 provided on the substrate 101, a gate line GL provided on the high heat-resistant planarization layer 102, a gate insulation layer 103 provided on the gate line GL, a semiconductor 104 provided on the gate insulation layer 103 to overlap the gate line GL, a first electrode 105 provided on the semiconductor 104, a second electrode 106 provided on the semiconductor 104 so as to be apart from the first electrode 105, a passivation layer 107 covering the first electrode 105, the second electrode 106, and the semiconductor 104, a planarization layer 108 provided on the passivation layer 107, and a pixel electrode 110 provided on the planarization layer 108 and electrically connected to the second electrode 106 through a contact hole formed in the planarization layer 108.

When the display panel 100 is a liquid crystal display panel, as illustrated in FIG. 16, a common electrode 111 can be further provided on the planarization layer 108 and can be covered by an insulation layer 109. In this case, the pixel electrode 110 can be provided on the insulation layer 109 and can be electrically connected to the second electrode 106 through a contact hole which is formed in the insulation layer 109 and the planarization layer 108. The first electrode 105, the second electrode 106, the semiconductor 104, the gate insulation layer 103, and the gate line GL can each perform a function of a transistor (a TFT) (particularly, a switching transistor) for controlling a light transmittance of liquid crystal included in the liquid crystal display panel. Such description can be applied to a display panel 100 illustrated in (b) and (c) of FIG. 16.

When the display panel 100 is an organic light emitting display panel, the common electrode 111 and the insulation layer 109 can be omitted. In this case, the pixel electrode 110 can be an anode of an OLED, a light emitting layer included in the OLED can be provided on the pixel electrode 110, and a cathode included in the OLED can be provided on the light emitting layer. The first electrode 105, the second electrode 106, the semiconductor 104, the gate insulation layer 103, and the gate line GL can each perform a function of a transistor (a TFT) (particularly, a driving transistor) for controlling the amount of light emitted from the OLED included in the organic light emitting display panel. Such description can be applied to the display panel 100 illustrated in (b) and (c) of FIG. 16.

Referring to (b) of FIG. 16, in the second pixel P2, the gate line GL can intersect with the second connection line CL2 as illustrated in FIGS. 2 and 10.

In this case, as illustrated in (b) of FIG. 16, the second pixel P2 of the display panel 100 can include a substrate 101, a high heat-resistant planarization layer 102 provided on the substrate 101, a gate line GL provided on the high heat-resistant planarization layer 102, a gate insulation layer 103 provided on the gate line GL, a second connection line CL2 provided on the gate insulation layer 103, a passivation layer 107 covering the second connection line CL2 and the gate insulation layer 103, a planarization layer 108 provided on the passivation layer 107, and a pixel electrode 110 provided on the planarization layer 108.

That is, in the present disclosure, as illustrated in (b), the first connection line CL1 and the second connection line CL2 can be provided on the gate insulation layer 103.

In this case, the connection line CL can be formed through the same process as the first and second electrodes 105 and 106 which are provided on the gate insulation layer 103 and configure the transistor (the TFT).

That is, a first electrode 105 and a second electrode 106 each configuring a transistor included in the pixel can be provided on the gate insulation layer 103, and the connection lines CL can be formed on the same layer as the first electrode 105 and the second electrode 106 at an upper end of the gate insulation layer 103.

Moreover, since the first electrode 105 and the second electrode 106 are provided on the semiconductor 104, the connection line CL can be provided on another semiconductor 104a which is formed through the same process as the semiconductor 104.

That is, the connection line CL can be formed through the same process as the first and second electrodes 105 and 106 configuring the TFT. In this case, the connection line CL can be directly provided on the gate insulation layer 103, or can be provided on the other semiconductor 104a which is formed through the same process as the semiconductor 104 configuring the transistor (the TFT), in order to have the same structure that of each of the first electrode 105 and the second electrode 106.

Finally, referring to (c) of FIG. 16, in the third pixel P3, the gate line GL can be connected to the second connection line CL2 as illustrated in FIGS. 2 and 10.

In this case, as illustrated in (c) of FIG. 16, the third pixel P3 of the display panel 100 can include a substrate 101, a high heat-resistant planarization layer 102 provided on the substrate 101, a gate line GL provided on the high heat-resistant planarization layer 102, a gate insulation layer 103 provided on the gate line GL, the other semiconductor 104a provided on the gate insulation layer 103 and electrically connected to the gate line GL through a contact hole formed in the gate insulation layer 103, the second connection line CL2 provided on the other semiconductor 104a, a passivation layer 107 covering the second connection line CL2 and the other semiconductor 104a, a planarization layer 108 provided on the passivation layer 107, and a pixel electrode 110 provided on the planarization layer 108.

As described above, the second connection line CL2 can be directly provided on the gate insulation layer 103, and in this case, the second connection line CL2 can be electrically connected to the gate line GL through a contact hole formed in the gate insulation layer 103.

When the connection lines CL are included in the substrate 101 as described above, the connection lines CL can be formed even without an additional process.

In above description, the high heat-resistant planarization layer 102 can be provided on the substrate 101, or in an embodiment described above with reference to FIG. 16, the high heat-resistant planarization layer 102 can be omitted.

However, in an embodiment described above with reference to FIG. 16, when other metal instead of the connection line CL should be provided on the substrate 101, the high heat-resistant planarization layer 102 can perform a function of reducing a parasitic capacitance between various metals provided on the high heat-resistant planarization layer 102 and the other metal.

In this case, the high heat-resistant planarization layer 102 can include a physical characteristic which is as described above with reference to FIG. 15.

Hereinafter, a structure of a display panel for reducing a parasitic capacitance will be described with reference to FIGS. 17 to 19. In the following description, descriptions which are the same as or similar to descriptions given above are omitted or will be briefly given.

Figure 17:
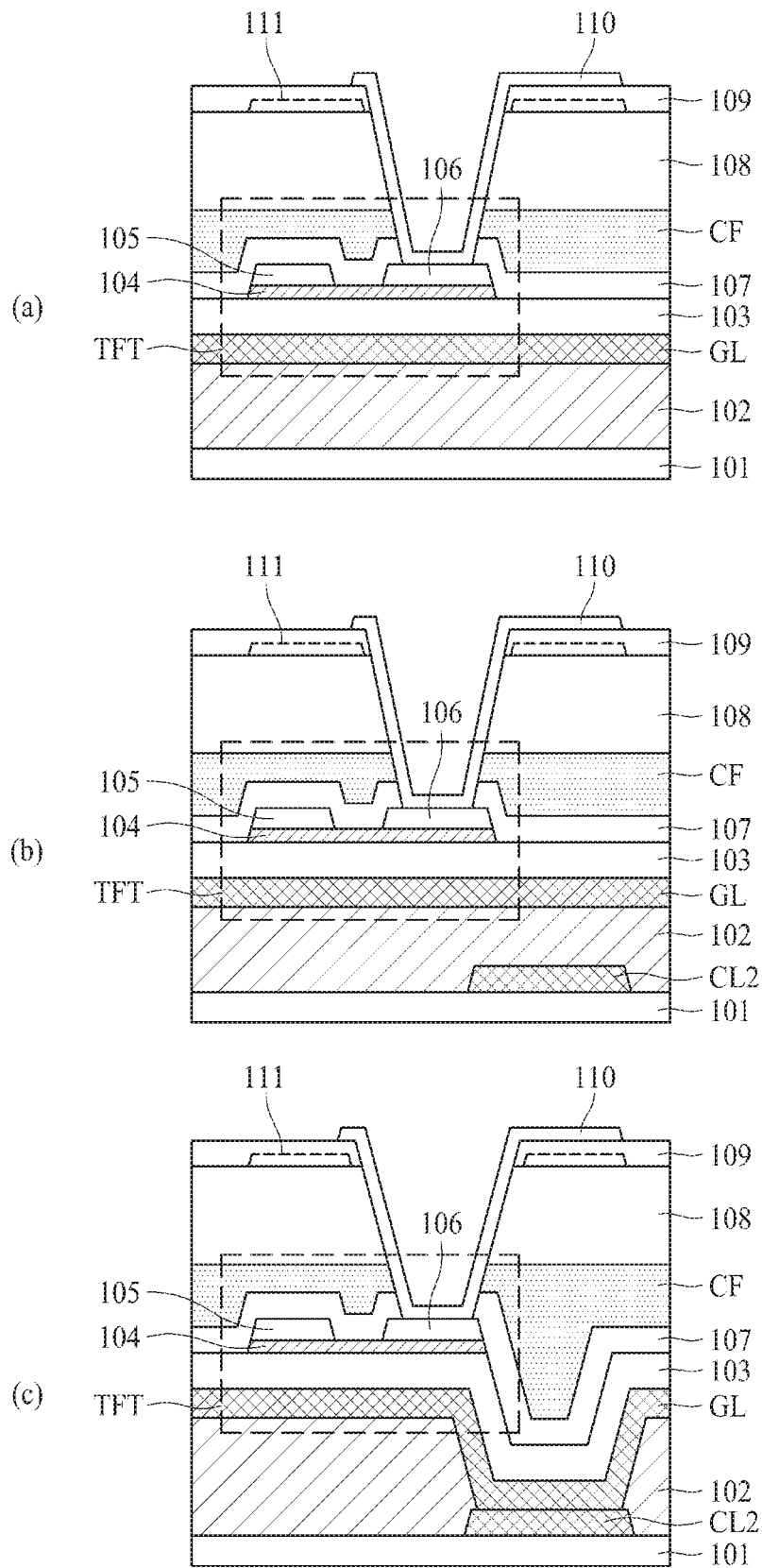
FIG. 17 is another exemplary diagram schematically illustrating the cross-sectional surface of the display panel illustrated in FIGS. 2 and 10.

FIG. 17 is another exemplary diagram schematically illustrating the cross-sectional surface of the display panel illustrated in FIGS. 2 and 10. Particularly, (a) of FIG. 17 schematically illustrates a cross-sectional surface taken along the first pixel P1 illustrated in FIGS. 2 and 10 in parallel with the gate line GL, (b) of FIG. 17 schematically illustrates a cross-sectional surface taken along the second pixel P2 illustrated in FIGS. 2 and 10 in parallel with the gate line GL, and (c) of FIG. 17 schematically illustrates a cross-sectional surface taken along the third pixel P3 illustrated in FIGS. 2 and 10 in parallel with the gate line GL. For convenience of description, in the cross-sectional surfaces illustrated in (a), (b), and (c), elements which are not directly illustrated in the cross-sectional surfaces are illustrated. To provide an additional description, the cross-sectional surfaces illustrated in (a), (b), and (c) are for describing an arrangement structure of the gate line GL and the second connection line CL2, and the other elements are schematically illustrated for convenience of description.

First, referring to (a) of FIG. 17, since the first pixel P1 includes only the gate line GL as illustrated in FIGS. 2 and 10, the second connection line CL2 is not included in the cross-sectional surface of the first pixel P1.

In this case, as illustrated in (a) of FIG. 17, the first pixel P1 of the display panel 100 can include a substrate 101, a high heat-resistant planarization layer 102 provided on the substrate 101, a gate line GL provided on the high heat-resistant planarization layer 102, a gate insulation layer 103 provided on the gate line GL, a semiconductor 104 provided on the gate insulation layer 103 to overlap the gate line GL, a first electrode 105 provided on the semiconductor 104, a second electrode 106 provided on the semiconductor 104 so as to be apart from the first electrode 105, a passivation layer 107 covering the first electrode 105, the second electrode 106, and the semiconductor 104, a color filter CF provided on the passivation layer 107, a planarization layer 108 provided on the color filter CF, and a pixel electrode 110 provided on the planarization layer 108 and electrically connected to the second electrode 106 through a contact hole formed in the planarization layer 108 and the color filter CF.

When the display panel 100 is a liquid crystal display panel, as illustrated in FIG. 17, a common electrode 111 can be further provided on the planarization layer 108 and can be covered by an insulation layer 109. In this case, the pixel electrode 110 can be provided on the insulation layer 109 and can be electrically connected to the second electrode 106 through a contact hole which is formed in the insulation layer 109, the planarization layer 108, and the color filter CF and the passivation layer 107. The first electrode 105, the second electrode 106, the semiconductor 104, the gate insulation layer 103, and the gate line GL can each perform a function of a transistor (a TFT) (particularly, a switching transistor) for controlling a light transmittance of liquid crystal included in the liquid crystal display panel.

Particularly, in the display panel 100, the color filter CF can be provided on the passivation layer 107. The color filter CF can perform a function of determining a color of light emitted from the pixel.

That is, when the display panel 100 is the liquid crystal display panel, light emitted from a backlight unit provided under the substrate 101 can be transferred to the outside through the color filter CF, the insulation layer 109, the liquid crystal provided on the insulation layer 109, and an upper substrate provided on the liquid crystal. Accordingly, a user can see color light output through the upper substrate.

Such description can be applied to the display panel 100 illustrated in (b) and (c) of FIG. 17.

When the display panel 100 is an organic light emitting display panel, the common electrode 111 and the insulation layer 109 can be omitted. In this case, the pixel electrode 110 can be an anode of an OLED, a light emitting layer included in the OLED can be provided on the pixel electrode 110, and a cathode included in the OLED can be provided on the light emitting layer. The first electrode 105, the second electrode 106, the semiconductor 104, the gate insulation layer 103, and the gate line GL can each perform a function of a transistor (a TFT) (particularly, a driving transistor) for controlling the amount of light emitted from the OLED included in the organic light emitting display panel.

That is, when the display panel 100 is the organic light emitting display panel, the pixel electrode 110 can be connected to the second electrode 106 through a contact hole formed in the passivation layer 107, the color filter CF and the planarization layer 108, and the color filter CF can be provided under the pixel electrode 110. Since FIG. 17 illustrates a cross-sectional surface of the organic light emitting display panel, the color filter CF is not illustrated under the pixel electrode 110. However, in a plan view, the color filter CF can be provided under the pixel electrode 110 at a portion, except a portion with the contact hole formed therein, of the pixel electrode 110.

In this case, the pixel electrode 110 can perform a function of an anode electrode of the organic light emitting display panel, and thus, as described above, a light emitting layer can be provided on the pixel electrode 110 and a cathode can be provided on the light emitting layer.

Light emitted from the light emitting layer can be transferred to the outside through the color filter CF, the gate insulation layer 103, the high heat-resistant planarization layer 102, and the substrate 101. Accordingly, a user can see color light output through the substrate 101.

Such description can be applied to the display panel 100 illustrated in (b) and (c) of FIG. 17. Referring to (b) of FIG. 17, in the second pixel P2, the gate line GL can intersect with the second connection line CL2 as illustrated in FIGS. 2 and 10.

In this case, as illustrated in (b) of FIG. 17, the second pixel P2 of the display panel 100 can include a substrate 101, the second connection line CL2 provided on the substrate 101, a high heat-resistant planarization layer 102 covering the second connection line CL2, a gate line GL provided on the high heat-resistant planarization layer 102, a gate insulation layer 103 provided on the gate line GL, a semiconductor 104 provided on the gate insulation layer 103 to overlap the gate line GL, a first electrode 105 provided on the semiconductor 104, a second electrode 106 provided on the semiconductor 104 so as to be apart from the first electrode 105, a passivation layer 107 covering the first electrode 105, the second electrode 106, and the semiconductor 104, a color filter CF provided on the passivation layer 107, a planarization layer 108 provided on the color filter CF, and a pixel electrode 110 provided on the planarization layer 108 and electrically connected to the second electrode 106 through a contact hole formed in the planarization layer 108, the color filter CF and the passivation layer 107.

That is, in the present disclosure, as illustrated in (b) of FIG. 17, the first connection line CL1 and the second connection line CL2 can be provided on the substrate 101 and can be covered by the high heat-resistant planarization layer 102. Finally, referring to (c) of FIG. 17, in the third pixel P3, the gate line GL can be connected to the second connection line CL2 as illustrated in FIGS. 2 and 10.

In this case, as illustrated in (c) of FIG. 17, the third pixel P3 of the display panel 100 can include a substrate 101, the second connection line CL2 provided on the substrate 101, a high heat-resistant planarization layer 102 covering the second connection line CL2, a gate line GL provided on the high heat-resistant planarization layer 102, a gate insulation layer 103 provided on the gate line GL, a semiconductor 104 provided on the gate insulation layer 103 to overlap the gate line GL, a first electrode 105 provided on the semiconductor 104, a second electrode 106 provided on the semiconductor 104 so as to be apart from the first electrode 105, a passivation layer 107 covering the first electrode 105, the second electrode 106, and the semiconductor 104, a color filter CF provided on the passivation layer 107, a planarization layer 108 provided on the color filter CF, and a pixel electrode 110 provided on the planarization layer 108 and electrically connected to the second electrode 106 through a contact hole formed in the planarization layer 108, the color filter CF and the passivation layer 107.

That is, in the present disclosure, as illustrated in (b) of FIG. 17, the first connection line CL1 and the second connection line CL2 can be provided on the substrate 101 and can be covered by the high heat-resistant planarization layer 102.

Particularly, as illustrated in (c) of FIG. 17, the second connection line CL2 can be connected to the gate line GL through a contact hole formed in the high heat-resistant planarization layer 102, and moreover, the first connection line CL1 can be connected to the gate line GL through a contact hole formed in the high heat-resistant planarization layer 102.

To provide an additional description, as illustrated in FIGS. 1, 2, and 10, the connection lines CL can extend in a direction (i.e., the second direction) from the fourth non-display area NA4 of the display panel 100 to the first non-display area NA1, and the gate lines GL can extend a direction (particularly, the first direction vertical to the second direction) which differs from the connection lines CL.

In this case, as illustrated in FIG. 17, the connection lines CL can be provided on the substrate 101, insulated from the gate line GL by the high heat-resistant planarization layer 102, and electrically connected to the gate line GL through a contact hole formed in the high heat-resistant planarization layer 102.

The reason that the connection lines CL are included in the substrate 101 and the substrate 101 is covered by the high heat-resistant planarization layer 102 as described above is for decreasing a load of the connection line CL and reducing a parasitic capacitance occurring between the connection line CL and at least one of various metals (for example, the first electrode 105, the second electrode 106, the common electrode 111, and the data line) included in the display panel 100.

Particularly, as a thickness of the high heat-resistant planarization layer 102 is thickened, an interval between metals provided on the high heat-resistant planarization layer 102 and the connection line CL can increase, and thus, a magnitude of a parasitic capacitance occurring between the connection line CL and the metals can decrease. That is, the high heat-resistant planarization layer 102 can perform a function of planarizing an upper end of the connection line CL and a function of decreasing the parasitic capacitance occurring between the connection line CL and other metals.

In this case, since the gate line GL, the semiconductor 104, the first electrode 105, and the second electrode 106 each requiring a high temperature process are provided on the high heat-resistant planarization layer 102, and thus, the high heat-resistant planarization layer 102 should use a high heat-resistant material.

Therefore, a relative dielectric constant of the high heat-resistant planarization layer 102 should be greater than 2 and less than 4, a uniformity (Max−Min) of the high heat-resistant planarization layer 102 should be greater than 0 and less than 0.2 μm, a weight loss of the high heat-resistant planarization layer 102 in a high temperature process performed on oxide at a temperature of more than 400° C. should be greater than 0.1% and less than 1%, the high heat-resistant planarization layer 102 should be chemically stable so that weight loss or deformation of a material characteristic does not occur due to metal etching, and a contact characteristic with a different layer should be good. That is, the weight loss, the relative dielectric constant, and the uniformity should be as small as possible.

Moreover, when a display panel including the high heat-resistant planarization layer 102 is a liquid crystal display panel, the high heat-resistant planarization layer 102 should have a transmittance of 70% to 100%.

That is, the high heat-resistant planarization layer 102 can include a material having a physical characteristic similar to that of silicon oxide ($SiO_2$).

Moreover, as described above, since the color filter CF is provided between the passivation layer 107 and the planarization layer 108, a parasitic capacitance occurring between metal lines provided on the planarization layer 108 and metal lines provided under the passivation layer 107 can be reduced. Hereinafter, this will be described with reference to FIG. 19.

Figure 18:
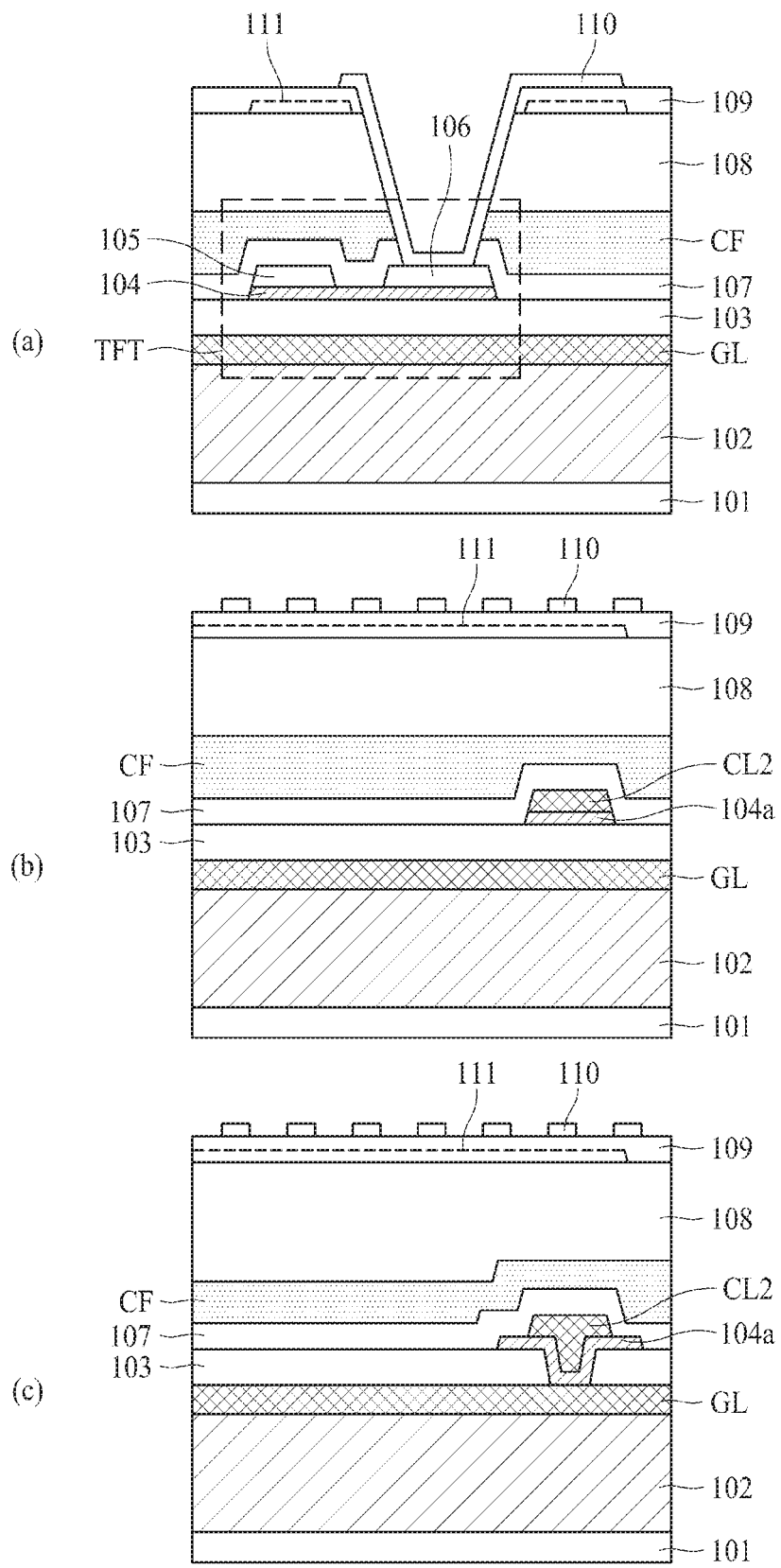
FIG. 18 is another exemplary diagram schematically illustrating the cross-sectional surface of the display panel illustrated in FIGS. 2 and 10.

FIG. 18 is another exemplary diagram schematically illustrating the cross-sectional surface of the display panel illustrated in FIGS. 2 and 10. Particularly, (a) of FIG. 18 schematically illustrates a cross-sectional surface taken along the first pixel P1 illustrated in FIGS. 2 and 10 in parallel with the gate line GL, (b) of FIG. 18 schematically illustrates a cross-sectional surface taken along the second pixel P2 illustrated in FIGS. 2 and 10 in parallel with the gate line GL, and (c) of FIG. 18 schematically illustrates a cross-sectional surface taken along the third pixel P3 illustrated in FIGS. 2 and 10 in parallel with the gate line GL. For convenience of description, in the cross-sectional surfaces illustrated in (a), (b), and (c), elements which are not directly illustrated in the cross-sectional surfaces are illustrated. To provide an additional description, the cross-sectional surfaces illustrated in (a), (b), and (c) are for describing an arrangement structure of the gate line GL and the second connection line CL2, and the other elements are schematically illustrated for convenience of description.

First, referring to (a) of FIG. 18, since the first pixel P1 includes only the gate line GL as illustrated in FIGS. 2 and 10, the second connection line CL2 is not included in the cross-sectional surface of the first pixel P1.

In this case, as illustrated in (a) of FIG. 18, the first pixel P1 of the display panel 100 can include a substrate 101, a high heat-resistant planarization layer 102 provided on the substrate 101, a gate line GL provided on the high heat-resistant planarization layer 102, a gate insulation layer 103 provided on the gate line GL, a semiconductor 104 provided on the gate insulation layer 103 to overlap the gate line GL, a first electrode 105 provided on the semiconductor 104, a second electrode 106 provided on the semiconductor 104 so as to be apart from the first electrode 105, a passivation layer 107 covering the first electrode 105, the second electrode 106, and the semiconductor 104, a color filter CF provided on the passivation layer 107, a planarization layer 108 provided on the color filter CF, and a pixel electrode 110 provided on the planarization layer 108 and electrically connected to the second electrode 106 through a contact hole formed in the planarization layer 108, the color filter CF and the passivation layer 107.

When the display panel 100 is a liquid crystal display panel, as illustrated in FIG. 18, a common electrode 111 can be further provided on the planarization layer 108 and can be covered by an insulation layer 109. In this case, the pixel electrode 110 can be provided on the insulation layer 109 and can be electrically connected to the second electrode 106 through a contact hole which is formed in the insulation layer 109, the planarization layer 108, the color filter CF and the passivation layer 107. The first electrode 105, the second electrode 106, the semiconductor 104, the gate insulation layer 103, and the gate line GL can each perform a function of a transistor (a TFT) (particularly, a switching transistor) for controlling a light transmittance of liquid crystal included in the liquid crystal display panel.

Particularly, in the display panel 100, the color filter CF can be provided on the passivation layer 107. The color filter CF can perform a function of determining a color of light emitted from the pixel.

That is, when the display panel 100 is the liquid crystal display panel, light emitted from a backlight unit provided under the substrate 101 can be transferred to the outside through the color filter CF, the insulation layer 109, the liquid crystal provided on the insulation layer 109, and an upper substrate provided on the liquid crystal. Accordingly, a user can see color light output through the upper substrate.

Such description can be applied to the display panel 100 illustrated in (b) and (c) of FIG. 18.

When the display panel 100 is an organic light emitting display panel, the common electrode 111 and the insulation layer 109 can be omitted. In this case, the pixel electrode 110 can be an anode of an OLED, a light emitting layer included in the OLED can be provided on the pixel electrode 110, and a cathode included in the OLED can be provided on the light emitting layer. The first electrode 105, the second electrode 106, the semiconductor 104, the gate insulation layer 103, and the gate line GL can each perform a function of a transistor (a TFT) (particularly, a driving transistor) for controlling the amount of light emitted from the OLED included in the organic light emitting display panel.

That is, when the display panel 100 is the organic light emitting display panel, the pixel electrode 110 can be connected to the second electrode 106 through a contact hole formed in the passivation layer 107, the color filter CF and the planarization layer 108, and the color filter CF can be provided under the pixel electrode 110. Since FIG. 18 illustrates a cross-sectional surface of the organic light emitting display panel, the color filter CF is not illustrated under the pixel electrode 110. However, in a plan view, the color filter CF can be provided under the pixel electrode 110 at a portion, except a portion with the contact hole formed therein, of the pixel electrode 110.

In this case, the pixel electrode 110 can perform a function of an anode electrode of the organic light emitting display panel, and thus, as described above, a light emitting layer can be provided on the pixel electrode 110 and a cathode can be provided on the light emitting layer.

Light emitted from the light emitting layer can be transferred to the outside through the color filter CF, the gate insulation layer 103, the high heat-resistant planarization layer 102, and the substrate 101. Accordingly, a user can see color light output through the substrate 101.

Such description can be applied to the display panel 100 illustrated in (b) and (c) of FIG. 18.

Referring to (b) of FIG. 18, in the second pixel P2, the gate line GL can intersect with the second connection line CL2 as illustrated in FIGS. 2 and 10.

In this case, as illustrated in (b) of FIG. 18, the second pixel P2 of the display panel 100 can include a substrate 101, a high heat-resistant planarization layer 102 provided on the substrate 101, a gate line GL provided on the high heat-resistant planarization layer 102, a gate insulation layer 103 provided on the gate line GL, a second connection line CL2 provided on the gate insulation layer 103, a passivation layer 107 covering the second connection line CL2 and the gate insulation layer 103, a color filter CF provided on the passivation layer 107, a planarization layer 108 provided on the color filter CF, and a pixel electrode 110 provided on the planarization layer 108.

That is, in the present disclosure, as illustrated in (b), the first connection line CL1 and the second connection line CL2 can be provided on the gate insulation layer 103.

In this case, the connection line CL can be formed through the same process as the first and second electrodes 105 and 106 which are provided on the gate insulation layer 103 and configure the transistor (the TFT).

Moreover, since the first electrode 105 and the second electrode 106 are provided on the semiconductor 104, the connection line CL can be provided on another semiconductor 104a which is formed through the same process as the semiconductor 104.

That is, the connection line CL can be formed through the same process as the first and second electrodes 105 and 106 configuring the TFT. In this case, the connection line CL can be directly provided on the gate insulation layer 103, or can be provided on the other semiconductor 104a which is formed through the same process as the semiconductor 104 configuring the transistor (the TFT), in order to have the same structure that of each of the first electrode 105 and the second electrode 106.

Finally, referring to (c) of FIG. 18, in the third pixel P3, the gate line GL can be connected to the second connection line CL2 as illustrated in FIGS. 2 and 10.

In this case, as illustrated in (c) of FIG. 18, the third pixel P3 of the display panel 100 can include a substrate 101, a high heat-resistant planarization layer 102 provided on the substrate 101, a gate line GL provided on the high heat-resistant planarization layer 102, a gate insulation layer 103 provided on the gate line GL, the other semiconductor 104a provided on the gate insulation layer 103 and electrically connected to the gate line GL through a contact hole formed in the gate insulation layer 103, the second connection line CL2 provided on the other semiconductor 104a, a passivation layer 107 covering the second connection line CL2 and the other semiconductor 104a, a color filter CF provided on the passivation layer 107, a planarization layer 108 provided on the color filter CF, and a pixel electrode 110 provided on the planarization layer 108.

As described above, the second connection line CL2 can be directly provided on the gate insulation layer 103, and in this case, the second connection line CL2 can be electrically connected to the gate line GL through a contact hole formed in the gate insulation layer 103.

When the connection lines CL are included in the substrate 101 as described above, the connection lines CL can be formed even without an additional process. In above description, the high heat-resistant planarization layer 102 can be provided on the substrate 101, or in an embodiment described above with reference to FIG. 18, the high heat-resistant planarization layer 102 can be omitted.

However, in an embodiment described above with reference to FIG. 18, when other metal instead of the connection line CL is provided on the substrate 101, the high heat-resistant planarization layer 102 can perform a function of reducing a parasitic capacitance between various metals provided on the high heat-resistant planarization layer 102 and the other metal.

In this case, the high heat-resistant planarization layer 102 can include a physical characteristic which is as described above with reference to FIG. 17.

Moreover, as described above, since the color filter CF is provided between the passivation layer 107 and the planarization layer 108, a parasitic capacitance occurring between metals provided on the planarization layer 108 and metals provided under the passivation layer 107 can be reduced. Hereinafter, this will be described with reference to FIG. 19.

Figure 19:
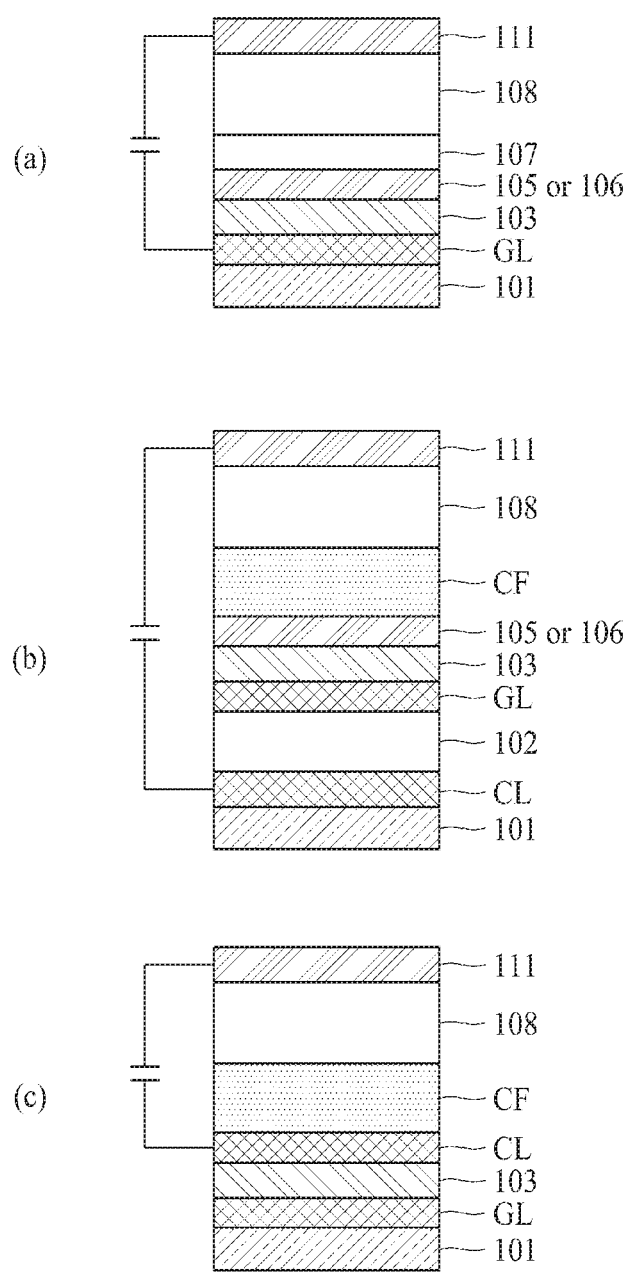
FIG. 19 is an exemplary diagram for describing the principle that a parasitic capacitance decreases in a display apparatus according to the present disclosure.

FIG. 19 is an exemplary diagram for describing the principle that a parasitic capacitance decreases in a display apparatus according to the present disclosure. Here, (a) of FIG. 19 is a cross-sectional view of a related art display panel, (b) of FIG. 19 is a cross-sectional view of the display panel described above with reference to FIG. 17, and (c) of FIG. 19 is a cross-sectional view of the display panel described above with reference to FIG. 18.

As described above with reference to FIGS. 17 and 18, in the display panel, the color filter CF can be provided on the passivation layer 107.

The color filter CF can decrease a parasitic capacitance occurring between metal or metal lines provided on the planarization layer 108 and metal or metal lines provided under the passivation layer 107.

For example, when the display panel is a liquid crystal display panel, a distance between a gate line GL and a common electrode 111 in a liquid crystal display panel where a color filter is not provided between a passivation layer 107 and a planarization layer 108 as illustrated in (a) of FIG. 19 can be less than a distance between a gate line GL and a common electrode 111 in a liquid crystal display panel where a color filter is provided between a passivation layer 107 and a planarization layer 108 as illustrated in (b) of FIG. 19, and moreover, can be less than a distance between a connection line CL and the common electrode 111. A parasitic capacitance is inversely proportional to a distance generally, and thus, as a distance between two electrodes increases, a parasitic capacitance can decrease.

Therefore, a parasitic capacitance between the gate line GL and the common electrode 111 in the liquid crystal display panel where the color filter is provided between the passivation layer 107 and the planarization layer 108 as illustrated in (b) of FIG. 19 can be less than a parasitic capacitance between the gate line GL and the common electrode 111 in a related art liquid crystal display panel where the color filter is not provided between the passivation layer 107 and the planarization layer 108 as illustrated in (a) of FIG. 19. Also, as illustrated in (b) of FIG. 19, in the liquid crystal display panel where a connection line CL is provided between the passivation layer 107 and a high heat-resistant planarization layer 102, a distance between the connection line CL and the common electrode 111 can more increase based on the color filter CF provided between the passivation layer 107 and the planarization layer 108, and thus, a parasitic capacitance between the connection line CL and the common electrode 111 can be reduced.

Moreover, a parasitic capacitance between a connection line CL and a common electrode 111 in a liquid crystal display panel of the present disclosure illustrated in (c) of FIG. 19 can be less than a parasitic capacitance between a connection line CL and a common electrode 111 in a related art liquid crystal display panel where a color filter CF is not provided between the connection line CL and the planarization layer 108.

In this case, according to the present disclosure described above, a feature where a parasitic capacitance between the gate line GL or the connection line CL provided under the color filter CF and the common electrode 111 provided on the color filter CF can be reduced has been described above. However, the present disclosure is not limited thereto.

For example, in the display panel applied to the present disclosure, since the color filter CF is provided between the passivation layer 107 and the planarization layer 108, a parasitic capacitance between various metals (for example, a common electrode, a pixel electrode, an anode electrode, a cathode electrode, and various power supply lines) provided on the planarization layer 108 and various metals (for example, a gate line, a connection line, a data line, a touch electrode, and various power supply lines) provided under the color filter CF can decrease compared to a parasitic capacitance of a related art display panel where the color filter CF is not provided between the passivation layer 107 and the planarization layer 108.

To provide an additional description, in the present disclosure, the color filter CF can perform a function of decreasing a parasitic capacitance between metals provided under and on the color filter CF.

Figure 20:
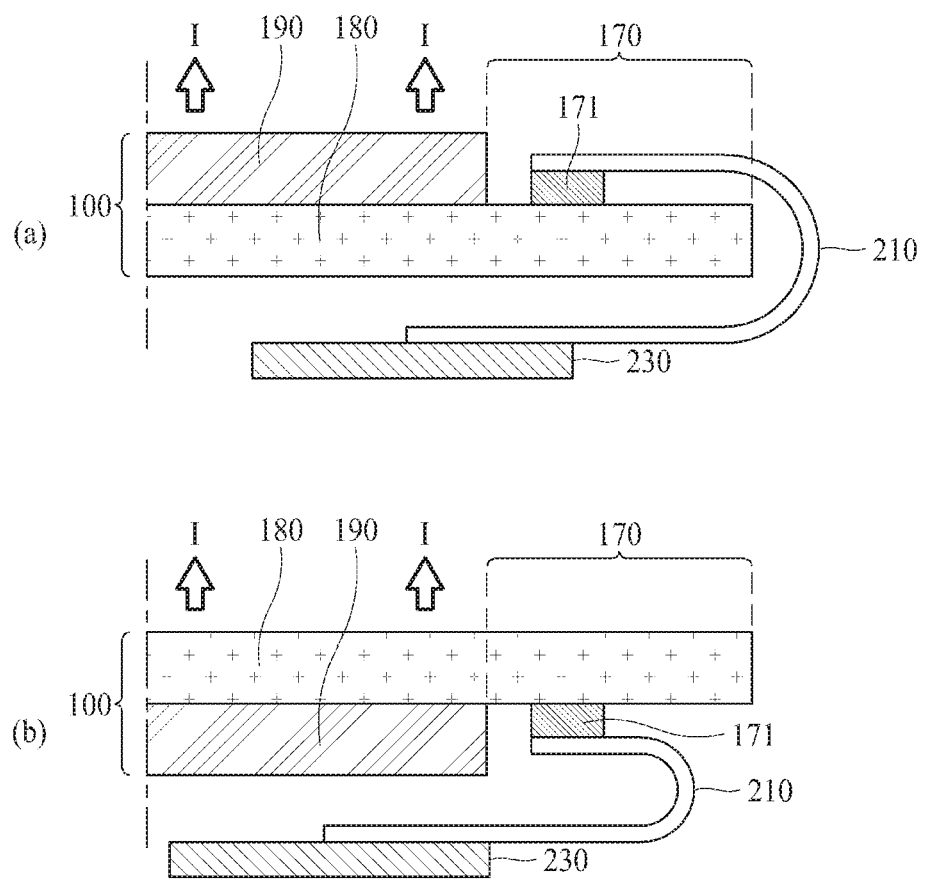
FIG. 20 is an exemplary diagram for describing a method of attaching a circuit film on a display panel, in a display apparatus according to the present disclosure.
Figure 21:
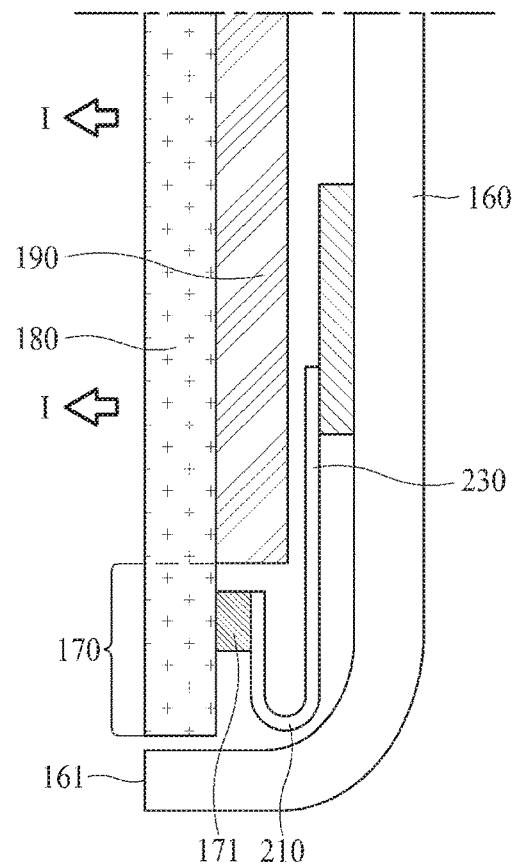
FIG. 21 is an exemplary diagram illustrating an example where the display panel illustrated in FIG. 20 is attached on a front cover.
Figure 22:
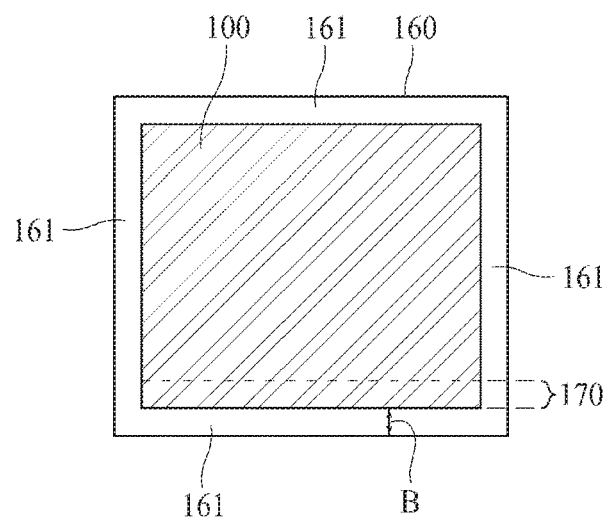
FIG. 22 is an exemplary diagram illustrating a front portion of the display panel illustrated in FIG. 21.

FIG. 20 is an exemplary diagram for describing a method of attaching a circuit film on a display panel, in a display apparatus according to the present disclosure. FIG. 21 is an exemplary diagram illustrating an example where the display panel illustrated in FIG. 20 is attached on a front cover. FIG. 22 is an exemplary diagram illustrating a front portion of the display panel illustrated in FIG. 21.

First, referring to FIG. 20, the display panel 100 can include a lower substrate 180 and an upper substrate 190. When the display panel 100 is a liquid crystal display panel, liquid crystal can be implanted into a region between the lower substrate 180 and the upper substrate 190.

The lower substrate 180 can be formed as various types as described above with reference to FIGS. 15 to 19.

When the display panel 100 is a liquid crystal display panel, the upper substrate 190 can perform a function of keeping implanted liquid crystal along with the lower substrate 180.

When the display panel 100 is an organic light emitting display panel, the upper substrate 190 can perform a function of covering the lower substrate 180 to prevent water from permeating into an OLED included in the lower substrate 180.

A pad part 170 described above can be provided in the lower substrate 180, and a circuit film 210 can be connected to the pad part 170, and then, can be bent and disposed at a lower end of the display panel.

Particularly, in a related art display panel, as illustrated in (a) of FIG. 20, the circuit film 210 connected to the pad part 170 included in the lower substrate 180 can be bent along a side surface of the lower substrate 180 and can be provided at a lower end of the lower substrate 180.

However, in a display panel applied to the present disclosure, as illustrated in (b) of FIG. 20, a circuit film 210 connected to a pad part 170 included in a lower substrate 180 can be bent along a side surface of the upper substrate 190 and can be provided at a lower end of the upper substrate 190.

That is, in a relate art display apparatus, an image I can be output to the outside through the upper substrate 190 as illustrated in (a) of FIG. 20, and in a display apparatus according to the present disclosure, an image I can be output to the outside through the lower substrate 180 as illustrated in (b) of FIG. 20.

In this case, in the display apparatus according to the present disclosure, as illustrated in FIG. 21, a plurality of pads 171 included in the pad part 170 may not be exposed at the outside, and thus, a front cover 160 for supporting the display panel may not need to cover the pad part 170.

The front cover 160 can perform a function of supporting the display panel 100, or can perform a function of forming an external appearance of the display apparatus. In a case where the front cover 160 performs the function of supporting the display panel 100, an external case of the display apparatus can more cover the front cover 160. However, an external appearance of the external case of the display apparatus can be based on an external appearance of the front cover 160, and thus, even in a case where the display apparatus further includes an external case, the description and the following description can be applied identically. Hereinafter, for convenience of description, a display apparatus where the front cover 160 forms an external appearance of the display apparatus will be described as an example of the present disclosure.

For example, when a user sees the front of the display apparatus according to the present disclosure, as illustrated in FIGS. 21 and 22, a whole front surface of the display panel 100 and only side portions 161 of the front cover 160 can be exposed. In this case, the pads 171 included in the pad part 170 can be covered by the lower substrate 180, and thus, may not be exposed at the outside.

That is, in the display apparatus according to the present disclosure, since the pads 171 included in the pad part 170 are not exposed at the outside, a front-surface front cover part applied to the related art display apparatus may not be provided.

Therefore, the whole front surface of the display panel 100 and only side portions 161 of the front cover 160 can be exposed at a user. Also, even when edge portions of the front surface of the display panel 100 are covered and supported by the front cover 160, a portion covered by the front cover 160 can be set as small as possible to accomplish the purpose of supporting the display panel 100.

Therefore, in the display apparatus according to the present disclosure, a width B of a bezel can be set to be equal to a width of each of the side portions 161 of the front cover 160, or can be set as small as possible to accomplish the purpose of supporting the display panel 100.

Moreover, in the display apparatus according to the present disclosure, widths of bezels included in four side surfaces of the display panel 100 can be equal. Accordingly, an aesthetic appearance of the display apparatus can be enhanced.

To provide an additional description, in the display apparatus according to the present disclosure, a TFT substrate (i.e., the lower substrate 180) including transistors can be exposed at the outside of the display apparatus 10, and thus, a width of a bezel of a front cover for covering or supporting each of the first to fourth non-display areas can be reduced.

For example, according to the above-described arrangement structure, although a size of the first non-display area is not substantially reduced in the present disclosure, the pad part may not be exposed in a direction toward the outside of the display apparatus 10, and thus, a width of a bezel of a front cover for covering the first non-display area including the pad part can be reduced. In this case, according to the present disclosure, since an area of each of the second and third non-display areas is reduced, a width of a bezel of a front cover for covering or supporting each of the second and third non-display areas can be reduced. Accordingly, according to the present disclosure, widths of bezels of front covers for covering or supporting the first to fourth non-display areas can all be reduced.

Features of the present disclosure described above will be described briefly.

First, in the present disclosure, since the gate driving circuit is disposed in a non-display area of each of three surfaces except a pad part, a left bezel area and a right bezel area can be reduced, and the delay of a gate pulse can be removed, thereby easily implementing high-speed driving.

Second, in the present disclosure, the connection line CL can be disposed on the substrate 101, and the high heat-resistant planarization layer 102 can be disposed between the connection line CL and the gate line GL, thereby decreasing a parasitic capacitance occurring between the metals provided on the high heat-resistant planarization layer 102 and the connection line CL.

Moreover, a parasitic capacitance can be reduced, and thus, widths of metal lines including the metals can be reduced, thereby decreasing widths of metal lines included in the non-display areas. Accordingly, the widths of the non-display areas can be more reduced.

Third, in the present disclosure, the color filter CF can be disposed between the passivation layer 107 and the planarization layer 108, thereby decreasing a parasitic capacitance between metals provided on the planarization layer 108 and metals provided under the passivation layer 107.

Moreover, a parasitic capacitance can be reduced, and thus, widths of metal lines including the metals can be reduced, thereby decreasing widths of metal lines provided in the non-display areas. Accordingly, the widths of the non-display areas can be more reduced.

Fourth, in the present disclosure, the lower substrate 180 including the pad part 170 among the lower substrate 180 and the upper substrate 190 each configuring the display panel 100 can be disposed to face the outside of the display apparatus according to the present disclosure, and thus, widths of four bezels corresponding to four non-display areas of the display apparatus can be reduced compared to the related art display apparatus, and particularly, widths of four bezels can be equal.

Moreover, in the present disclosure, the first feature can be variously combined with at least one of the second to fourth features.

In the display apparatus according to the present disclosure, since a plurality of gate driving circuits are distributed into and disposed in second to fourth non-display areas except a first non-display area where a pad part is disposed, a width of each of the second to fourth non-display areas can decrease, and the delay of a gate pulse can be removed to easily implement high-speed driving, thereby preventing an output difference between gate pulses in a display area.

Moreover, the display apparatus according to the present disclosure can decrease a parasitic capacitance occurring between metals included in different layers.

Moreover, in the display apparatus according to the present disclosure, a width of a bezel can be minimized, thereby enhancing an aesthetic appearance of the display apparatus.

The above-described feature, structure, and effect of the present disclosure are included in at least one embodiment of the present disclosure, but are not limited to only one embodiment. Furthermore, the feature, structure, and effect described in at least one embodiment of the present disclosure can be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus comprising:
a display panel including a display area and first to fourth non-display areas surrounding the display area, the display area including a plurality of pixels connected to a plurality of gate lines;
a pad part disposed in the first non-display area;
a first gate driving circuit disposed in the second non-display area to drive a first gate line group among the plurality of gate lines;
a second gate driving circuit disposed in the third non-display area to drive a second gate line group among the plurality of gate lines; and
a third gate driving circuit disposed in the fourth non-display area to drive the first and second gate line groups,
wherein the display panel further comprises a plurality of connection lines connecting gate lines of the first and second gate line groups to the third gate driving circuit,
the plurality of connection lines are provided on a substrate included in the display panel,
the plurality of connection lines are covered by a high heat-resistant planarization layer,
the plurality of gate lines are provided on the high heat-resistant planarization layer, and
each of the plurality of connection lines is connected to a corresponding gate line through a contact hole formed in the high heat-resistant planarization layer.

2. The display apparatus of claim 1, further comprising:
a color filter provided on a passivation layer covering a transistor included in each of the plurality of pixels; and
a planarization layer provided on the color filter,
wherein the passivation layer is provided on the plurality of gate lines.

3. The display apparatus of claim 1, wherein
the display panel further comprises a lower substrate including the plurality of pixels, and an upper substrate covering the lower substrate, and
an image generated by the display panel is output to the outside through the lower substrate.

4. The display apparatus of claim 3, wherein a plurality of pads included in the pad part are covered by the lower substrate and are not exposed.

5. The display apparatus of claim 1, wherein
the first gate line group corresponds to an odd gate line, and
the first gate driving circuit comprises an odd stage corresponding to the odd gate line.

6. The display apparatus of claim 1, wherein
the second gate line group corresponds to an even gate line, and
the second gate driving circuit comprises an even stage corresponding to the even gate line.

7. The display apparatus of claim 1, wherein the display area comprises:
a first display area adjacent to the first gate driving circuit; and
a second display area adjacent to the second gate driving circuit.

8. The display apparatus of claim 1, wherein
a relative dielectric constant of the high heat-resistant planarization layer is greater than 2 and less than 4,
a uniformity of the high heat-resistant planarization layer is greater than 0 and less than approximately 0.2 µm, and
a weight loss of the high heat-resistant planarization layer is greater than 0.1% and less than 1%.

9. A display apparatus comprising:
a display panel including a display area and first to fourth non-display areas surrounding the display area, the display area including a plurality of pixels connected to a plurality of gate lines:
a pad part disposed in the first non-display area;
a first gate driving circuit disposed in the second non-display area to drive a first gate line group among the plurality of gate lines;
a second gate driving circuit disposed in the third non-display area to drive a second gate line group among the plurality of gate lines; and a third gate driving circuit disposed in the fourth non-display area to drive the first and second gate line groups, wherein the display panel further comprises a plurality of connection lines connecting gate lines of the first and second gate line groups to the third gate driving circuit, the plurality of connection lines are provided on a gate insulation layer covering the plurality of gate lines, each of the plurality of connection lines is connected to a corresponding gate line through a contact hole formed in the gate insulation layer, a first electrode and a second electrode each configuring a transistor included in each of the plurality of pixels are provided on the gate insulation layer, and the plurality of connection lines are provided on the same layer as the first electrode and the second electrode, on the gate insulation layer.

10. The display apparatus of claim 9, wherein the transistor comprises a semiconductor, and another semiconductor including the same material as the semiconductor is provided between the gate insulation layer and each of the plurality of connection lines.

11. The display apparatus of claim 9, wherein
a metal line is provided on a substrate included in the display panel,
the metal line is covered by a high heat-resistant planarization layer, and
the plurality of gate lines are provided on the high heat-resistant planarization layer.

12. The display apparatus of claim 11, wherein
a relative dielectric constant of the high heat-resistant planarization layer is greater than 2 and less than 4,
a uniformity of the high heat-resistant planarization layer is greater than 0 and less than approximately 0.2 µm, and
a weight loss of the high heat-resistant planarization layer is greater than 0.1% and less than 1%.

13. A display apparatus comprising:
a display panel including a display area and first to fourth non-display areas surrounding the display area, the display area including a plurality of pixels connected to a plurality of gate lines:
a pad part disposed in the first non-display area;
a first gate driving circuit disposed in the second non-display area to drive a first gate line group among the plurality of gate lines;
a second gate driving circuit disposed in the third non-display area to drive a second gate line group among the plurality of gate lines; and
a third gate driving circuit disposed in the fourth non-display area to drive the first and second gate line groups,
wherein the display panel further comprises a plurality of connection lines connecting gate lines of the first and second gate line groups to the third gate driving circuit, and
the third gate driving circuit comprises an odd stage corresponding to the first gate line group and an even stage corresponding to the second gate line group.

14. The display apparatus of claim 13, wherein the plurality of connection lines comprise:
a first connection line connecting the odd stage of the third gate driving circuit to the first gate line group; and
a second connection line connecting the even stage of the third gate driving circuit to the second gate line group.

* * * * *